(12) United States Patent
Cheng et al.

(10) Patent No.: US 12,245,530 B2
(45) Date of Patent: Mar. 4, 2025

(54) PHASE CHANGE MEMORY WITH CONCENTRIC RING-SHAPED HEATER

(71) Applicant: International Business Machines Corporation, Armonk, NY (US)

(72) Inventors: Kangguo Cheng, Schenectady, NY (US); Carl Radens, LaGrangeville, NY (US); Juntao Li, Cohoes, NY (US); Ruilong Xie, Niskayuna, NY (US); Praneet Adusumilli, Somerset, NJ (US); Oscar van der Straten, Guilderland Center, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 542 days.

(21) Appl. No.: 17/358,223

(22) Filed: Jun. 25, 2021

(65) Prior Publication Data
US 2022/0416161 A1    Dec. 29, 2022

(51) Int. Cl.
*H10N 70/00* (2023.01)
(52) U.S. Cl.
CPC ....... *H10N 70/8613* (2023.02); *H10N 70/021* (2023.02); *H10N 70/841* (2023.02)
(58) Field of Classification Search
CPC ............. H10N 70/8613; H10N 70/826; G11C 2213/52
See application file for complete search history.

(56) References Cited

U.S. PATENT DOCUMENTS

| | | |
|---|---|---|
| 6,894,305 B2 | 5/2005 | Yi et al. |
| 6,927,410 B2 | 8/2005 | Chen |
| 7,348,620 B2 | 3/2008 | Chiang et al. |
| 7,485,891 B2 | 2/2009 | Hamann et al. |
| 7,679,163 B2 | 3/2010 | Chen et al. |

(Continued)

FOREIGN PATENT DOCUMENTS

| | | |
|---|---|---|
| CN | 101267016 A | 9/2008 |
| EP | 2891182 B1 | 7/2018 |

(Continued)

OTHER PUBLICATIONS

Cheng et al., "Phase Change Memory With Conductive Rings," U.S. Appl. No. 17/449,515, filed Sep. 30, 2021.

(Continued)

*Primary Examiner* — Amar Movva
(74) *Attorney, Agent, or Firm* — Kimberly Zillig

(57) ABSTRACT

A ring-shaped heater, system, and method to gradually change the conductance of the phase change memory through a concentric ring-shaped heater. The system may include a phase change memory. The phase change memory may include a bottom electrode. The phase change memory may also include a ring-shaped heater patterned on top of the bottom electrode, the ring-shaped heater including: a plurality of concentric conductive heating layers, and a plurality of insulator spacers, where each insulator spacer separates each conductive heating layer. The phase change memory may also include a phase change material proximately connected to the ring-shaped heater. The phase change memory may also include a top electrode proximately connected to the phase change material.

13 Claims, 15 Drawing Sheets

(56) References Cited

U.S. PATENT DOCUMENTS

| | | | |
|---|---|---|---|
| 7,701,749 | B2 | 4/2010 | Jeong et al. |
| 7,705,424 | B2 | 4/2010 | Lee et al. |
| 7,778,079 | B2 | 8/2010 | Jeong et al. |
| 7,932,507 | B2 | 4/2011 | Chen et al. |
| 8,187,946 | B2 | 5/2012 | Karpov et al. |
| 8,199,567 | B2 | 6/2012 | Chang-Wook et al. |
| 8,471,236 | B2 | 6/2013 | Breitwisch et al. |
| 8,648,326 | B2 | 2/2014 | Breitwisch et al. |
| 8,921,817 | B2 | 12/2014 | Son |
| 9,099,637 | B2 | 8/2015 | Song |
| 9,166,161 | B2 | 10/2015 | BrightSky et al. |
| 9,178,138 | B2 | 11/2015 | Tan et al. |
| 9,190,265 | B2 | 11/2015 | Liu et al. |
| 9,472,274 | B1 | 10/2016 | Lung |
| 9,558,823 | B1 | 1/2017 | Khwa et al. |
| 10,050,194 | B1 | 8/2018 | Nardi et al. |
| 10,056,546 | B2 | 8/2018 | BrightSky et al. |
| 10,141,503 | B1 | 11/2018 | BrightSky et al. |
| 10,374,010 | B2 | 8/2019 | Wu |
| 10,707,417 | B1 | 7/2020 | Bruce et al. |
| 10,991,879 | B2 | 4/2021 | Ruiz et al. |
| 2007/0274121 | A1* | 11/2007 | Lung .................. H10N 70/231 257/E45.002 |
| 2008/0061282 | A1 | 3/2008 | Sato et al. |
| 2008/0116437 | A1* | 5/2008 | Oh .................... H10N 70/8828 257/E47.001 |
| 2018/0205017 | A1 | 7/2018 | Bruce et al. |
| 2019/0123103 | A1* | 4/2019 | Wu .................... H10N 70/8413 |
| 2021/0091307 | A1 | 3/2021 | BrightSky et al. |

FOREIGN PATENT DOCUMENTS

| | | |
|---|---|---|
| JP | 5020045 B2 | 9/2012 |
| KR | 100849485 B1 | 7/2008 |
| KR | 1020170022423 A | 3/2017 |
| TW | I476770 B | 3/2015 |

OTHER PUBLICATIONS

Updated List of IBM Patents or Patent Applications Treated as Related, Dated Apr. 29, 2022, 2 pages.

Kim et al., "A Phase Change Memory Cell with Metallic Surfactant Layer as a Resistance Drift Stabilizer," IEEE, Printed Sep. 29, 2021, 4 pages.

Ryoo et al., "Ring Contact Electrode Process for High Density Phase Change Random Access Memory," Japanese Journal of Applied Physics, vol. 46, No. 4B, 2007, pp. 2001-2005.

Wong et al., "Phase Change Memory," IEEE, Proceedings of the IEEE, vol. 98, No. 12, Dec. 2010, 27 pages.

Chawla et al., "Effective electron mean free path in TiN(001)," Journal of Applied Physics 113, 2013, 7 pages.

Tuma et al., "Stochastic phase-change neurons," nature nanotechnology, Published Online: May 16, 2016 | DOI: 10.1038/NNANO.2016.70, 8 pages.

List of IBM Patents or Patent Applications Treated as Related, Dated Jun. 21, 2021, 2 pages.

Philip et al., "Phase Change Memory With Graded Heater," U.S. Appl. No. 17/358,293, filed Jun. 25, 2021.

* cited by examiner

PHASE CHANGE MEMORY WITH CONCENTRIC RING-SHAPED HEATER

BACKGROUND

The present disclosure relates to phase change memory and, more specifically, to gradually changing the conductance of the phase change memory through a concentric ring-shaped heater.

Phase change memory (PCM) is a non-volatile random access memory (NVRAM). PCMs contain phase-change materials (such as alloys containing Tellurium) and may alter the states (e.g., crystalline and amorphous phases) of the PCM using heat. The phase-change materials may be placed between two electrodes, and when the phase-change materials are in a crystalline state the phase-change materials have a high conductivity and a low resistivity (which corresponds to a logical 1), allowing current to travel quickly thorough the phase-change materials and between electrodes. When the phase-change materials are in an amorphous state the materials have a low conductivity and a high resistivity (which corresponds to a logical 0), preventing current from travelling quickly through the phase-change materials and between the electrodes. The data is stored using the contrast between resistances of the multiple states. Having these multiple states allows PCM to be a non-volatile memory, as the states can remain if/when power is removed, allowing PCMs to retain data even when there is no power.

SUMMARY

The present invention provides a ring-shaped heater, a system, and a method to gradually change the conductance and resistance of the phase change memory through a concentric ring-shaped heater. The ring-shaped heater may include a plurality of concentric conductive heating layers. The ring-shaped heater may also include a plurality of insulator spacers, where each insulator spacer separates each conductive heating layer.

The system may include a phase change memory. The phase change memory may include a bottom electrode. The phase change memory may also include a ring-shaped heater patterned on the bottom electrode, the ring-shaped heater including: a plurality of concentric conductive heating layers, and a plurality of insulator spacers, where each insulator spacer separates each conductive heating layer. The phase change memory may also include a phase change material proximately connected to the ring-shaped heater. The phase change memory may also include a top electrode proximately connected to the phase change material.

The method of forming a phase change memory may include forming a bottom electrode on top of a semiconductor substrate. The method may also include depositing a dielectric layer on top of the bottom electrode. The method may also include patterning the dielectric layer to create a via opening. The method may also include cyclically depositing a plurality of conductive heating layers, where each layer is deposited individually. The method may also include depositing a plurality of insulator spacers, where each insulator spacer separates each conductive heating layer. The method may also include removing portions of the plurality of conductive heating layers form the dielectric layer, leaving a plurality of concentric conductive heating layers. The method may also include depositing a phase change memory material on top of the plurality of concentric conductive heating layers. The method may also include depositing a top electrode.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1B:
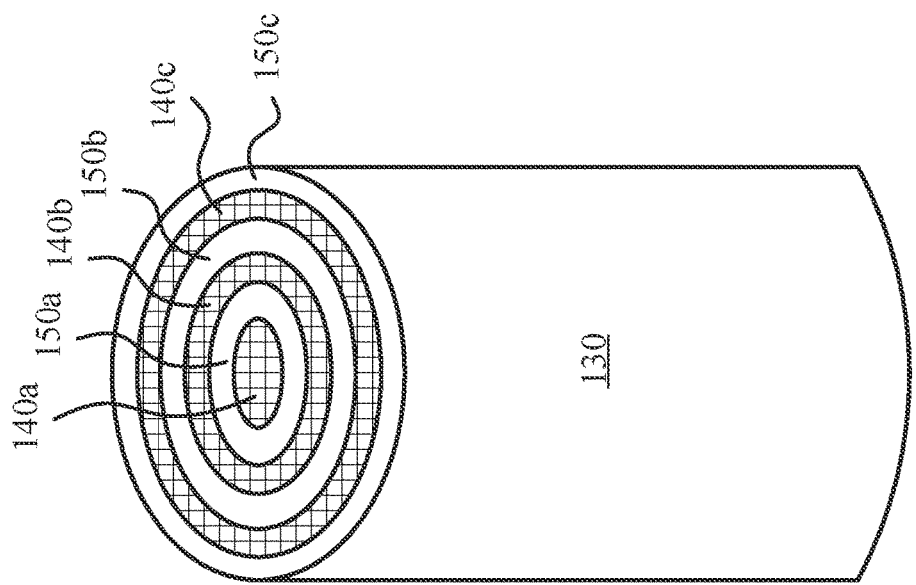
FIG. 1B depicts a second view of the concentric ring-shaped heater, according to some embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to phase change memory and, more specifically, to gradually changing the conductance of the phase change memory through a concentric ring-shaped heater. While the present disclosure is not necessarily limited to such applications, various aspects of the disclosure may be appreciated through a discussion of various examples using this context.

A phase change memory (PCM) may include a bottom electrode and a top electrode with a phase change material between the two. As discussed above, conventional phase change memories (PCMs) and their corresponding phase change materials have two states—amorphous and crystalline. The amorphous state may be referred to as a RESET state and the crystalline state may be referred to as a SET state. To switch the phase change material between the two states, the PCM may also include a heater (sometimes called the bottom electrode contact) that sends current pulses through the heater (from the electrode) and into the phase change material. When the phase change material is in a crystalline state, the heater may convert the material into an amorphous state by sending short high current pulses to rapidly heat the phase change material and then quenching or cooling it. When the phase change material is in an amorphous state, the heater may convert the material into a crystalline state by sending a longer, but lower current, pulse(s) to heat the phase change material to a crystallization temperature for a prolonged period of time (without cooling the material) to allow for the material to become crystalline.

When the phase change material (of the phase change memory) is in an amorphous state (or a RESET state), the phase change material may have a high resistivity and a low conductivity (i.e., high electrical resistivity and low electrical conductivity), and current may not travel quickly through the phase change material. Alternatively, when the phase change material is in a crystalline state (or a SET state), the phase change material may have a low resistivity and a high conductivity (i.e., low electrical resistivity and high electrical conductivity), and current may travel quickly through the phase change material. The data may be stored in the phase change memory (PCM) using the contrast between the resistances of the two states (or phases). Further, each state may correspond to a binary value, with an amorphous state corresponding to a 0 and a crystalline state corresponding to a 1. PCM has many benefits, such as increased speeds (compared to other types of memory), non-volatile capabilities, less power requirements, etc., however, conventional PCMs may have abrupt changes between the phases, particularly at the amorphous state (i.e., an abrupt change to the RESET state).

Resistance, as referred to herein, may be an electrical resistance, and may refer to the objection or opposition of current flow through an object. Resistivity, as referred to herein, may be an electrical resistivity, and may refer to the resistance (i.e., electrical resistance) per unit area of an object and/or material. Resistivity may, for example, be calculated using the magnitude of the electric field and the magnitude of the current density (i.e., the magnitude of the electric field divided by the magnitude of the current density). Resistance may be calculated, for example, by multiplying the resistivity by the length of the object and/or material and dividing by the cross-sectional area of the object and/or material. When resistivity remains constant, the resistance of an object can be changed by changing the length, width, etc. of the object. For example, a titanium nitride (TiN) material may have different amounts of resistance depending on the length, width, etc. of the TiN object, however the resistivity of TiN may remain the same.

Similarly, conductance, as referred to herein, may be an electrical conductance, and may refer to the ease of current flow through an object (i.e., how easily current flows through an object). Conductivity, as referred to herein, may be an electrical conductivity, and may refer to the conductance (i.e., electrical conductance) per unit area of an object and/or material. When conductivity remains constant, the conductance of an object can be changed by changing the length, width, etc. of the object. Resistivity and conductivity are intrinsic properties, whereas resistance and conductance are extrinsic properties.

In PCMs, when current travels through the heater, heat is generated (for instance, through the Joule heating effect) and the heat can change the phase of the phase change material from a crystalline to an amorphous phase (or vice versa, depending on the amount of heat and whether there is a quench). Therefore, the greater the electrical conductance or the lesser the electrical resistance (referred to herein as conductance and resistance, respectively), the greater the flow of current traveling through the heater and the greater the amount of heat generated from the flowing current.

PCM has many possible applications, such as analog computing, cognitive computing, neuromorphic applications, etc. However, in various applications, it may be desired to have a PCM with multiple states, instead of just an amorphous state and a crystalline state. For instance, it may be desired to have a PCM with phase-change materials that are in a partially amorphous state and a partially crystalline state. Having multiple states may allow for a more gradual transition between the different conductance (for example, between the high conductance of the crystalline state and the low conductance of the amorphous state), which may be beneficial for many PCM applications. For instance, conventional PCMs may abruptly change between crystalline and amorphous states, however the gradual transition between the states and their corresponding conductance values may accelerate multiply and accumulate operations as well as achieve a symmetrical (and gradual) long-term depression and long-term potentiation (which may be very beneficial for PCM applications such as cognitive computing, neuromorphic applications, etc.). In conventional PCMs, it may be difficult to progressively and gradually increase and decrease the conductance of the PCM as at least the RESET phase (i.e., changing to the amorphous state) is typically very abrupt.

The present disclosure provides a ring-shaped heater, a system, and a method for gradually changing the conductance of the phase change memory through a concentric ring-shaped heater. The concentric ring-shaped heater may have multiple concentric layers of heating material (i.e., heating layers), and each heating layer may be separated by an insulator layer. With these different layers as well as the concentric shape the layers are in, the multiple heating layers (in the single heater) may act similar to multiple PCMs in parallel. This allows for each individual heating layer to have different levels of conductance and/or resistance, which then transfers different amounts of heat to different areas of the phase change material (of the PCM).

For example, a heating layer with a high conductance may rapidly heat the phase change material in the area near the specific heating layer (as greater amounts of current flow are travelling through the specific heating layer, therefore generating more heat), which may change the phase change material in this area from a crystalline solid to an amorphous solid (as crystalline solids may be converted to amorphous solids by rapidly heating them and then quenching or cooling them). This way, when one portion of the phase change material (of the PCM) is RESET to an amorphous state with high resistance, other portions of the phase change material may still be in a crystalline state due to the amount of heat and conductance from heating layers near those portions of the phase change material. Amorphous solids may be converted to crystalline solids by keeping the material (for example, the phase change material) at a crystallization temperature for a prolonged period of time, or at least enough time for the material to become crystallized, without cooling the material. Therefore, in another example, if a phase change material is in an amorphous state, portions of the material could be converted to a crystalline state if the specific heating layer(s) in that area maintained a crystallization temperature for a prolonged period of time without cooling. Through the concentric ring-shaped heater, there may be more phases (such as intermediate phases with both crystalline and amorphous areas) and the transitions between phases of the phase change material is more gradual, while the physics of the phase change material (such as the melting point, boiling point, etc.) are not fundamentally changed.

Figure 1A:
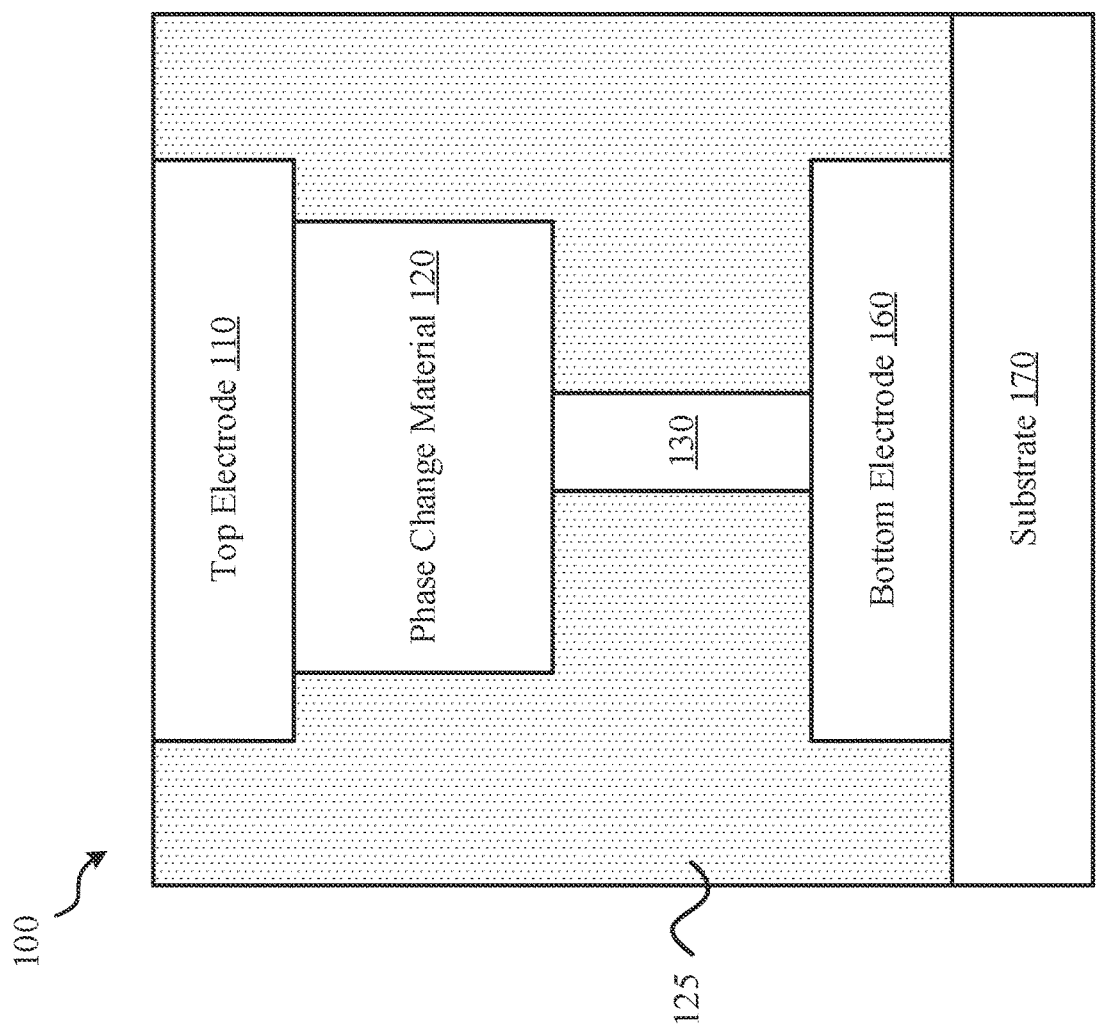
FIG. 1A depicts an example phase change memory with a concentric ring-shaped heater, according to some embodiments.

Referring now to FIG. 1A, an example phase change memory 100 with a concentric ring-shaped heater is depicted, according to some embodiments. FIG. 1A presents a cross-sectional view of the phase change memory 100. Phase change memory 100 includes a substrate 170, a bottom electrode 160, a heater 130, a phase change material 120, and a top electrode 110. The substrate 170 may be a semiconductor substrate, in some instances. In some instances, the substrate 170 may include other devices such as transistors, isolation structures, contacts, etc. The phase change memory 100 includes two electrodes—a bottom electrode 160 and a top electrode 110—with a phase change material 120 between the two. The electrodes 110 and 160 may send electrons and currents back and forth, ultimately sending the currents into the phase change material 120, which may alter its state (i.e., to an amorphous state and/or crystalline state). In some embodiments, the bottom electrode 160 is smaller than the top electrode 110 so that more current/heat enters the phase change material 120 from the bottom electrode 160 and changes the phase of the phase change material 120 at the area closest to the bottom electrode 160. In some embodiments, the bottom electrode 160 and/or the top electrode 110 are made of a metal material such as copper, tungsten, titanium nitride (TiN), etc.

The phase change material 120 is a material that is able to change from a crystalline phase to an amorphous phase and vice versa. Example phase change materials 120 include germanium-antimony-tellurium (or $Ge_2Sb_2Te_5$, referred to herein as GST), $GeTe/Sb_2Te_3$, or any other alternative materials.

The heater 130 (sometimes called a bottom electrode contact) is located between the bottom electrode 160 and the phase change material 120. Because the heater 130 makes contact with both the bottom electrode 160 and the phase change material 120, the heater 130 is able to channel the current from the bottom electrode 160 and expose the phase change material 120 to the current from the bottom electrode 160 at the contact point between the heater 130 and the phase change material 120 (i.e., concentrate the current at the contact point). In some embodiments, the bottom electrode 160 and the heater 130 may be referred to together as a heating electrode.

Put in different terms, the bottom portion of heater 130 is proximately connected to the top portion of bottom electrode 160. The top portion of heater 130 is proximately connected to the bottom portion of the phase change material 120. Lastly, the top portion of the phase change material 120 is proximately connected to the top electrode 110.

As used herein, the term "proximately connected" describes a connection between two components in relation the remainder of one of those components. For example, heater 130 can be described as proximately connected to the bottom end of phase change material 120 as compared to the top end of the phase change material 120 because heater 130 is connected more directly to the bottom end of phase change material 120 than the top end. Thus, even though heater 130 may have an electrical connection to both the top and bottom ends of phase change material 120, heater 130 is more directly connected to the bottom portion of phase change material 120 that the top portion of phase change material 120. By this reasoning, therefore, heater 130 is proximately connected to the bottom portion of phase change material 120, as illustrated.

FIG. 1B depicts a second view of heater 130, according to some embodiments. As discussed herein, in conventional PCMs, the phase change material may abruptly change from SET to RESET (i.e., crystalline to amorphous) or vice versa, without any gradual change between phases. However, in some instances, it is desirable to have a gradual change between the phases, as the gradual change may introduce more phases (which may introduce multibit storage), accelerate operations such as multiply and accumulate, etc. Heater 130 enables a gradual change between phases of the phase change material 120, through the concentric ring-shape and the multiple layers of the heater 130. For instance, heater 130 includes heating layers 150*a*, 150*b*, and 150*c* (referred to collectively as heating layers 150) that transmit heat (i.e., current) from the bottom electrode 160 to the phase change material 120. Each heating layer 150 is separated by an insulator spacer (or layer) 140*a*, 140*b*, and/or 140*c* (referred to collectively as insulator spacers 140). The insulator spacers 140 are made of insulator material with a high resistance (for example, higher than the conductive heating layers), therefore preventing and/or reducing current from the bottom electrode 160 to the phase change material 120 through the insulator spacers 140. In some embodiments, the insulator spacers 140 are made of a solid material. In some embodiments, the insulator spacers 140 are made of silicon nitride (SiN), silicon dioxide ($SiO_2$), or any other insulator material. The heating layers 150 may be made of titanium nitride (TiN), tantalum nitride (TaN), titanium, copper, tungsten, or any other conductor material.

In some embodiments, different insulator spacers 140 may comprise different materials. For example, insulator spacer 140*a* may be a SiN spacer, insulator spacer 140*b* may be a $SiO_2$ spacer, and insulator spacer 140*c* may again be a SiN spacer. Similarly, in some embodiments, different heating layers 150 may comprise different materials. For example, heating layer 150*a* may comprise TiN, heating layer 150*b* may comprise TaN, and heating layer 150*c* may comprise titanium. The different materials may have different conductivities and resistivities, which may result in various heating layers 150 having different conductivities.

For example, titanium has a lower conductivity than TiN and TaN, TiN has a higher conductivity than titanium but a lower conductivity than TaN, and TaN has a higher conductivity than both TiN and titanium. Having heating layers 150 with different materials of different conductivities may allow more or less current/heat from the bottom electrode 160 to reach the phase change material, depending on the material(s)—and the corresponding resistivities and/or conductivities—of the heating layer 150. This may result in different portions of the phase change material 120 (for example, corresponding to the heating layer 150 they are nearest to) having different levels of resistance and/or resistivity and, in some instances, different phases.

In some embodiments, the heating layers 150 may have different compositions. For instance, even if each heating layer 150 is made up of TiN, various heating layers 150 may include different amounts of titanium and nitrogen, therefore changing the compositions of the components within the heating layers 150. For example, heating layers 150 with higher compositions of titanium may have higher conductivity (and lower resistivity) compared to heating layers 150 with higher compositions of nitrogen.

In some embodiments, the heating layers 150 may have various thicknesses and/or lengths. Changing the thicknesses and/or lengths of the heating layers 150 may change the conductance of the various heating layers 150. For example, heating layers 150 with a greater thickness may transfer more current/heat than thinner heating layers 150. Similarly, in another example, heating layers 150 with shorter lengths between the bottom electrode 160 and the phase change material 120 may transfer current/heat more quickly than longer heating layers 150, which may expose the phase change material 120 to more heat/current in areas with heating layers 150 with shorter lengths. This is discussed further herein in relation to FIG. 17.

Further, as depicted in FIG. 1B, each heating layer 150 and insulator spacer 140 may be in a concentric ring shape. This concentric ring shape includes an insulator core (i.e., insulator spacer 140a) and alternating layers of heating layers 150 and insulator spacers 140. The concentric ring-shape, the plurality of heating layers 150, and the insulator spacers 140 between each heating layer 150 allow each heating layer 150 to execute in parallel, and act similar to multiple resistors running in parallel. This may allow each heating layer 150 (or at least multiple heating layers 150) to execute with different resistance (or conductance) levels, which then results in different areas of the phase change material 120 being exposed to the current (and the corresponding heat generated from the current) from the heater at different amounts, times, etc. which allows the phase change material 120 to more gradually change between phases. Although heater 130 has three heating layers 150 and three insulator spacers 140, the heater 130 may have any number of heating layers 150 and insulator spacers 140 (as long as there is an insulator spacer 140 separating each heating layer 150).

In some embodiments, as depicted in FIG. 1A, top electrode 110, phase change material 120, heater 130, and bottom electrode 160 are surrounded by (for example, encapsulated in) a dielectric 125. The dielectric 125 may act as an electric insulator to prevent the current and heat from the electrodes 110 and 160 and the heater 130 to transfer to any other materials in a computer system (as the phase change memory 100 may be one component within a computer system).

Figure 2:
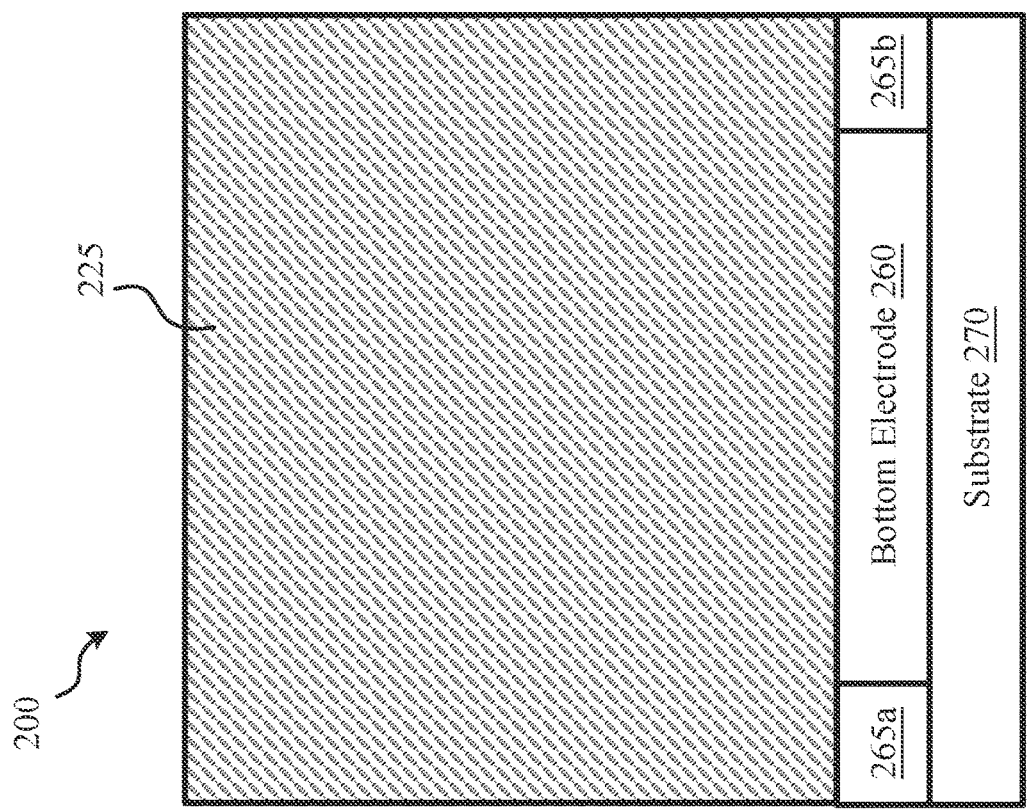
FIG. 2 depicts a schematic diagram of a first intermediary step of depositing a dielectric layer, according to some embodiments.

Referring to FIG. 2, a first intermediary step 200 of depositing a dielectric layer is depicted, according to some embodiments. In some instances, FIGS. 2-9 depict the steps to form a phase change memory with a concentric ring-shaped heater (depicted in FIG. 10, for instance). In some embodiments, FIGS. 2-9 depict the steps to form phase change memory 100 (FIG. 1). FIGS. 2-9 may depict a cross-sectional view of forming the phase change memory with the concentric ring-shaped heater. The components of the phase change memory depicted in FIGS. 2-9 may not be to scale, and instead may be enlarged to better illustrate the phase change memory and its formation.

To form a PCM with a concentric ring-shaped heater, the PCM may start with a substrate 270. The substrate 270 may be a semiconductor substrate, in some instances, and may include other devices (e.g., transistors, isolation structures, contacts, etc.). A bottom electrode 260 may be formed on top of the substrate 270, for example using a complementary metal-oxide semiconductor (CMOS) back end of the line (BEOL) damascene process. The bottom electrode 260 is surrounded by dielectric 265a and 265b (referred to collectively as dielectric 265), for instance to protect the bottom electrode 260 and preventing any other components of the computer system (i.e., outside of the PCM) from being exposed to the current/heat from the bottom electrode 260. As an example, the bottom electrode 260 may be tungsten and may be surrounded by a low-k dielectric.

To start forming the heater portion of the PCM, a second dielectric 225 may be deposited on top of the bottom electrode 260 and the existing dielectric 265. In some embodiments, dielectric 225 and dielectric 265 may be made up of silicon nitride (SiN), silicon dioxide ($SiO_2$), or any other dielectric material. In some embodiments, dielectric 265 and dielectric 225 may be different materials. In some embodiments, dielectric 265 and dielectric 225 may be the same material. In some instances, when dielectric 265 and dielectric 225 are the same material, the bottom electrode 260 may not initially be surrounded by dielectric 265, and instead dielectric 265 may be deposited at the same time as dielectric 225.

Figure 3:
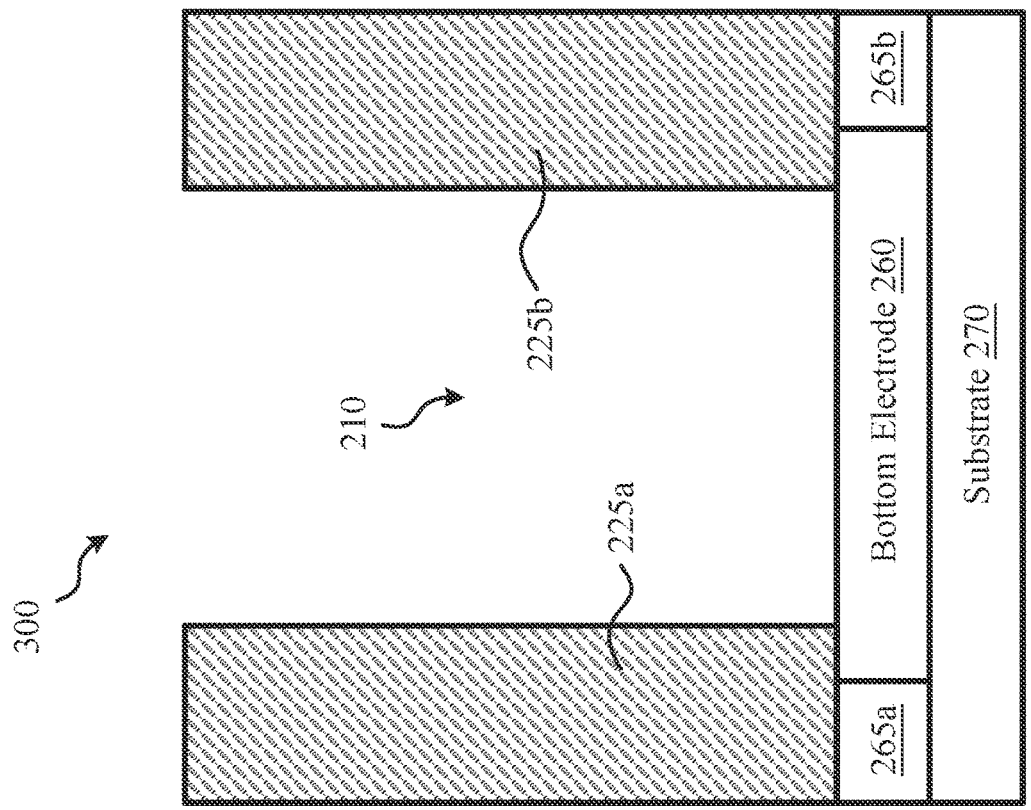
FIG. 3 depicts a schematic diagram of a second intermediary step of creating a via opening, according to some embodiments.

Referring to FIG. 3, a second intermediary step 300 of creating a via opening is depicted, according to some embodiments. Once the dielectric 225 is deposited on top of the bottom electrode 260 (and in some instances, the dielectric 265), the dielectric 225 may be patterned to form a via opening 210. This may separate the dielectric 225 into dielectric 225a and 225b (referred to collectively as dielectric 225). For instance, the dielectric 225 may be etched to create the via opening 210 directly above the bottom electrode 260.

Figure 4:
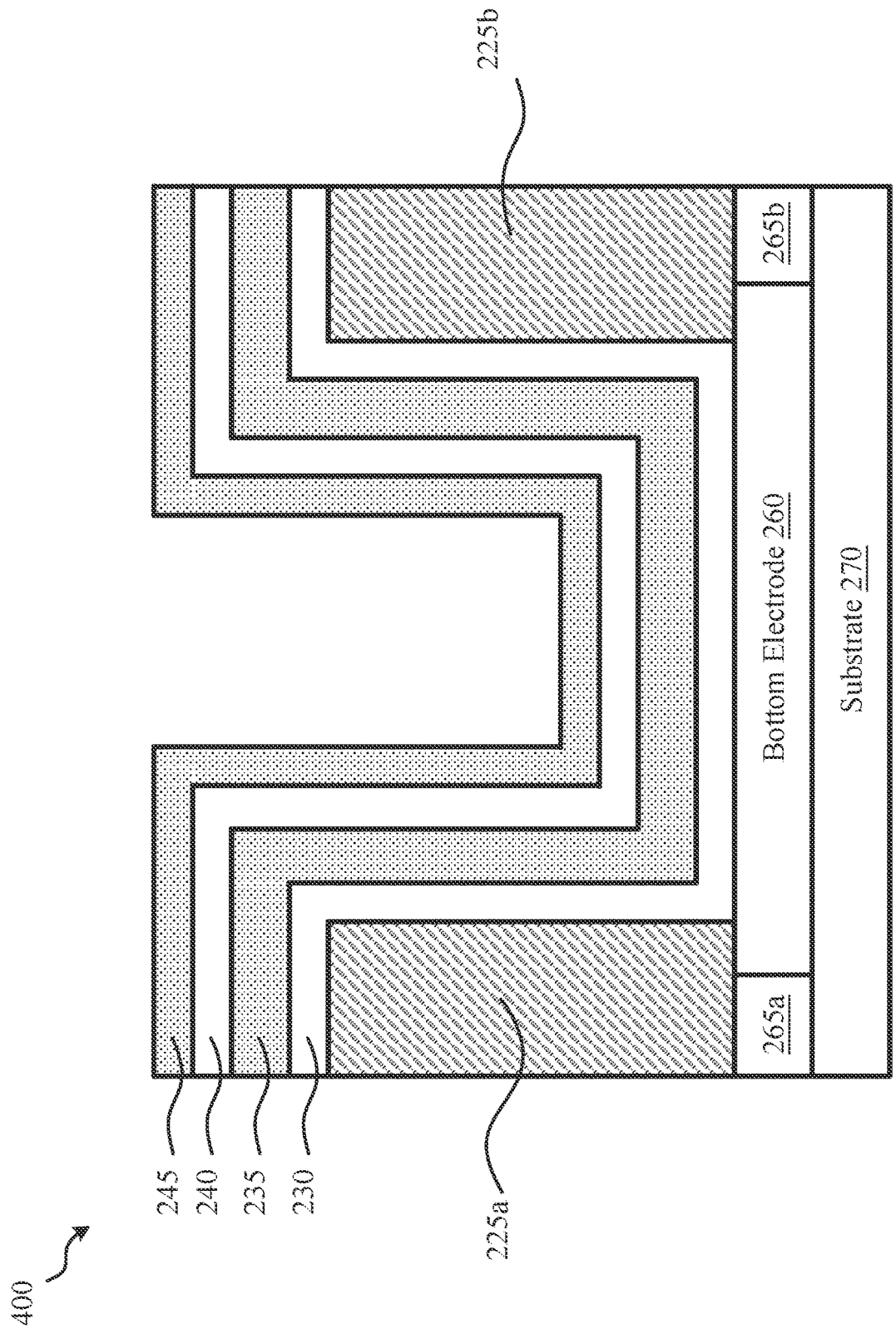
FIG. 4 depicts a schematic diagram of a third intermediary step of depositing conductive heating and insulator spacer layers, according to some embodiments.

Referring to FIG. 4, a third intermediary step 400 of depositing conductive heating and insulator spacer layers is depicted, according to some embodiments. Once the dielectric 225 has been patterned and the via opening 210 (FIG. 3) has been created, the layers of conductive heating and insulator spacers can be deposited. First, a conductive heating layer 230 may be deposited so that the conductive heating layer 230 has contact with the bottom electrode 260. Then an insulator spacer 235 may be deposited on top of the conductive heating layer 230. This process may repeat, alternating between conductive heating layers and insulator spacers. FIG. 4 depicts two conductive heating layers 230 and 240, and two insulator spacers 235 and 245, but any number of conductive heating layers and insulator spacers may be used. For example, there may be five conductive heating layers and five insulator spacers.

In some embodiments, each layer (i.e., the conductive heating layers 230 and 240 and the insulator spacers 235 and 245) may be deposited through a cyclic deposition. A cyclic deposition deposits the material in a circle and/or closed curve, such that each layer is its own closed curve. Deposition techniques such as atomic layer deposition (ALD), chemical vapor deposition (CVD), and/or laser induced chemical vapor disposition (LCVD) may be used to deposit the conductive heating layers 230 and 240 and the insulator spacers 235 and 245. In some embodiments, each layer may be deposited individually. By using cyclic deposition techniques to deposit each layer, each layer may form a concentric ring-shape.

In some embodiments, one or more of the conductive heating layers may be different thicknesses, different materials, etc. This way, each conductive heating layer 230 and 240 may have a different conductance and resistance, which may help vary the quickness and/or amount of the phase change material that changes stages (i.e., between crystalline and amorphous). This is further discussed herein.

Figure 5:
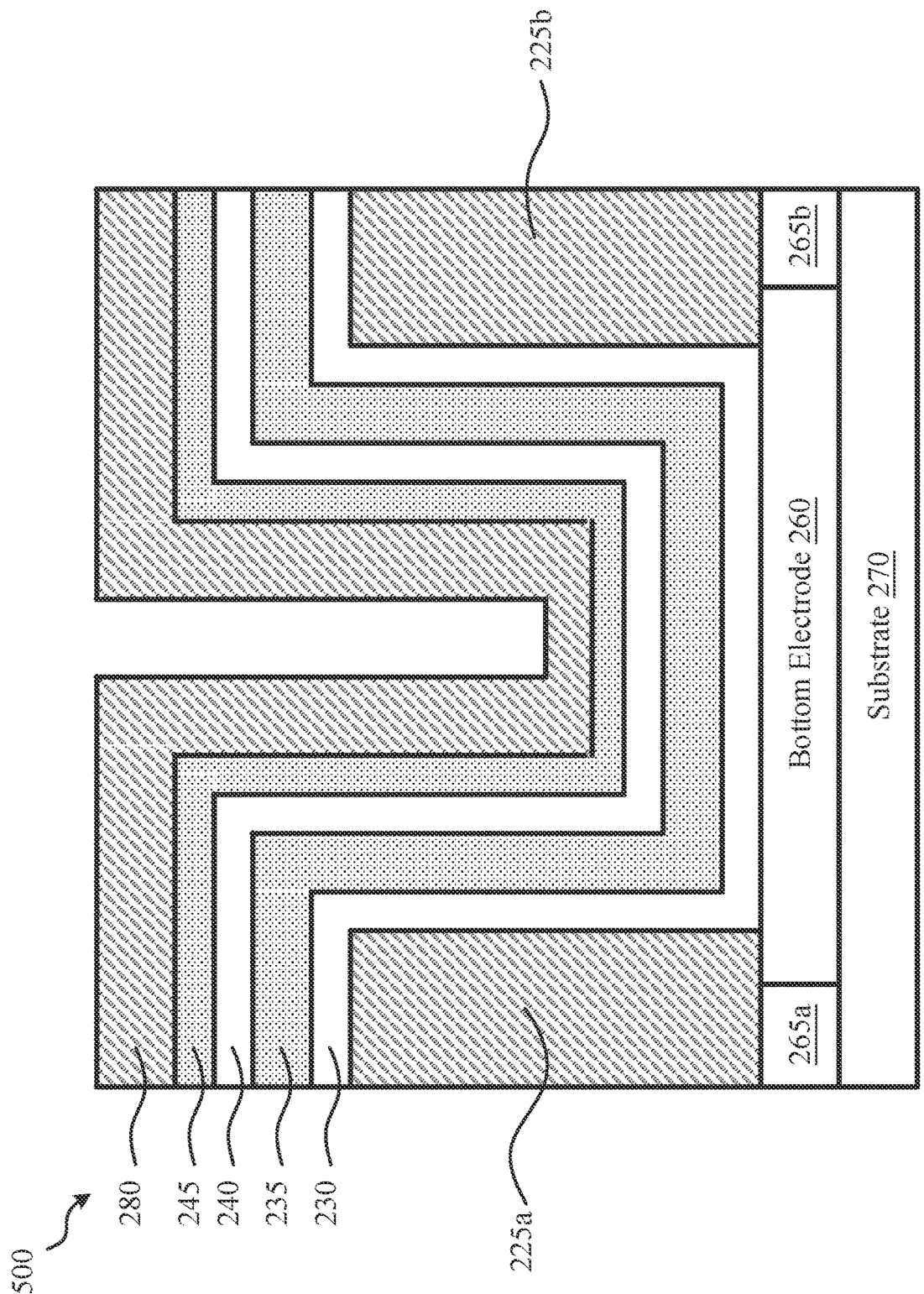
FIG. 5 depicts a schematic diagram of a fourth intermediary step of depositing a sacrificial layer of insulator material, according to some embodiments.

Referring to FIG. 5, a fourth intermediary step 500 of depositing a sacrificial layer of insulator material is depicted, according to some embodiments. When the layers (230, 235, 240, and 245) are deposited (depicted in FIG. 4), an opening should remain in the middle of the concentric ring-shape of the layers so that there is room to deposit the sacrificial layer 280. Sacrificial layer 280 may be deposited using the same cyclic deposition methods used in FIG. 4. In some embodiments, a sacrificial layer 280 is essentially a placeholder layer that is used to help create and/or hold a spot for future materials. The sacrificial layer 280 may be selectively removed, or entirely removed, as other materials are put in its place. In this instance, the sacrificial layer 280 is used to help create an opening to expose each of the heating layers 230 and 240 to the bottom electrode 260 and to act as a placeholder for future conductor materials. These steps will be further discussed herein. The thickness of the sacrificial layer 280 may be used to determine the size of the opening (discussed further herein, and depicted in FIG. 6). Therefore, the thickness of the sacrificial layer 280 may be predetermined (e.g., by the system and/or a user) in order to have a proper sized opening. In some embodiments, the sacrificial layer 280 is an insulator material such as SiN or $SiO_2$. In some embodiments, the sacrificial layer 280 is an insulator material different than the insulator spacer 245, so that when sacrificial layer 280 is removed in future steps (discussed further herein), the removal process does not also remove insulator spacer 245.

Figure 6:
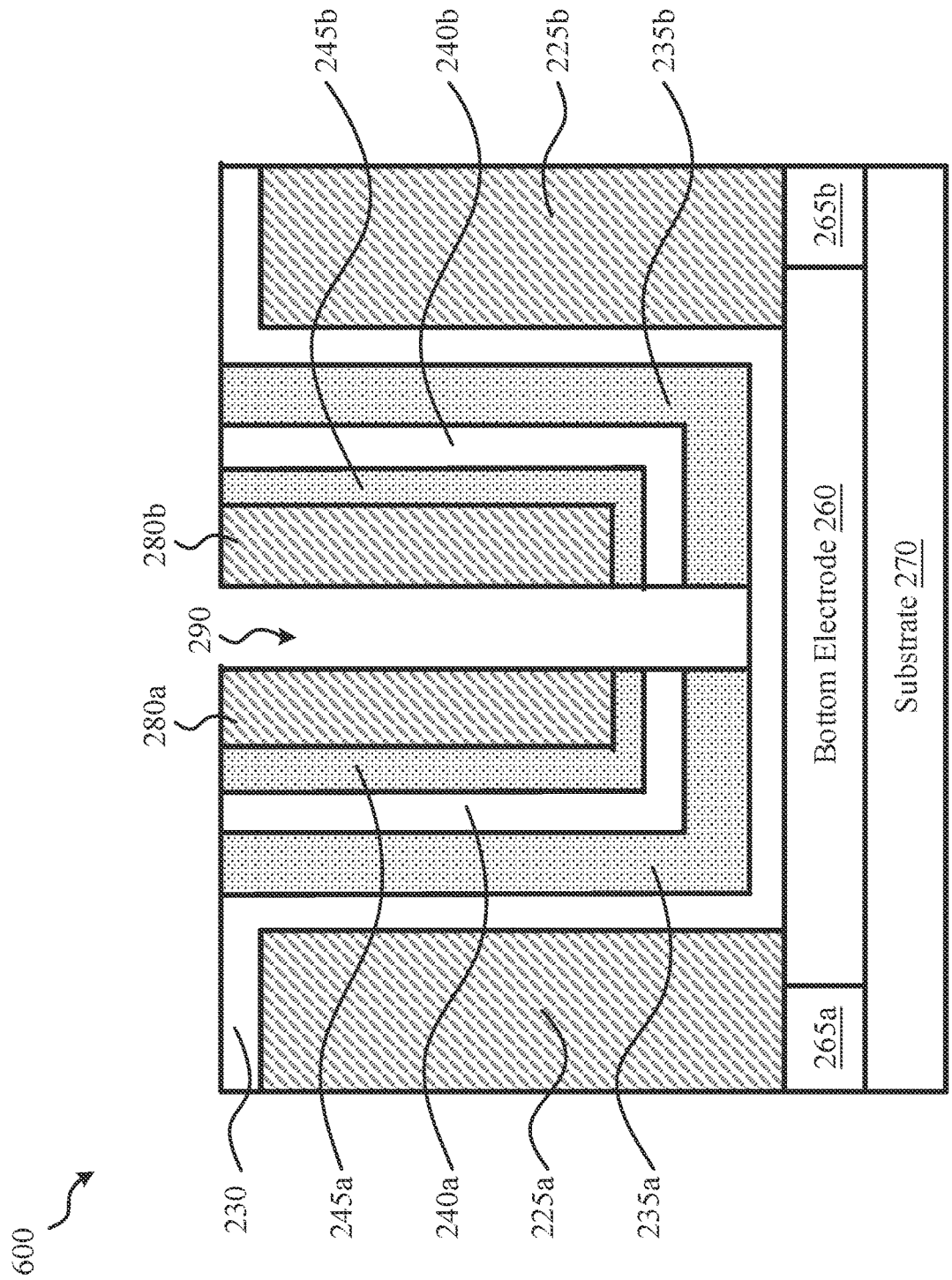
FIG. 6 depicts a schematic diagram of a fifth intermediary step of patterning an opening through the layers, according to some embodiments.

Referring to FIG. 6, a fifth intermediary step 600 of patterning an opening 290 through the layers is depicted, according to some embodiments. As discussed above, the thickness of the sacrificial layer 280 may define the size of the opening 290. As depicted in FIG. 5, there is a small opening in the middle of the sacrificial layer 280. The layers 230, 235, 240, 245, and the sacrificial layer 280 may be patterned in order to extend the opening 290 created by the sacrificial layer 280. For example, the layers may be etched through, starting with the sacrificial layer, then the insulator spacer 245, the conductive heating layer 240, and then the insulator spacer 235, so that an opening is created all the way down to conductive heating layer 230.

Additionally, the top side portions of the layers 245, 240, 235, and sacrificial layer 280 may be etched such that the conductive heating layer 230 is the only layer with a portion extending over the dielectric 225a and 225b. This may result in two sides of each layer—235a and 235b of insulator spacer 235, 240a and 240b of conductive heating layer 240, 245a and 245b of insulator spacer 245, and 280a and 280b of sacrificial layer 280—separated by the opening 290.

In some embodiments, the etching of the portions of the layers 245, 240, 235, and sacrificial layer 280 may be executed using reactive-ion etching (RIE). In some embodiments, a cyclic RIE (for example, a SiN RIE followed by a cyclic TiN/$SiO_2$ RIE when the conductive heating layer 240 comprises TiN, the insulator spacers 235 and 245 comprise $SiO_2$, and the sacrificial layer 280 comprises SiN) may be executed, cyclically removing the portion of each layer one by one. In some embodiments, the opening 290 may be patterned prior to the RIE (or another form of etching). In some embodiments, the RIE may occur prior to patterning the opening 290. In some embodiments, patterning the opening and conducting the RIE may occur concurrently.

Figure 7:
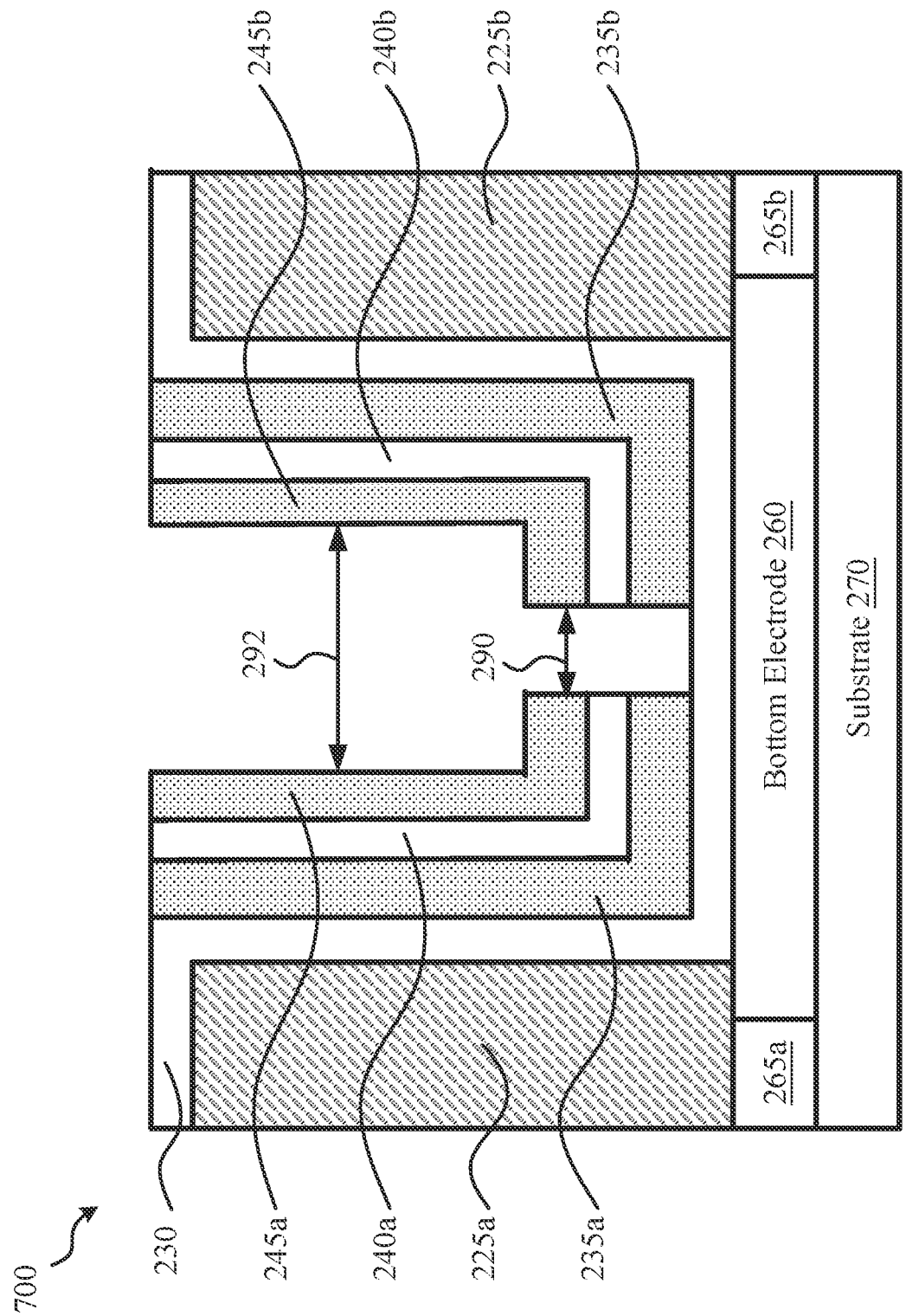
FIG. 7 depicts a schematic diagram of a sixth intermediary step of removing the sacrificial layer, according to some embodiments.

Referring to FIG. 7, a sixth intermediary step 700 of removing the sacrificial layer 280 is depicted, according to some embodiments. A portion of the sacrificial layer 280 may have already been removed using an etching method such as RIE (discussed above). However, two portions of the sacrificial layer 280a and 280b remained, separated by the opening 290, as depicted by FIG. 6. FIG. 7 depicts the partially formed phase change memory after the removal of the sacrificial layers 280a and 280b. In some embodiments, the remaining portions of the sacrificial layer 280a and 280b may be removed using RIE, buffered oxide etching, or other forms of etching. In some embodiments, the sacrificial layer 280 may be made of a different material than the insulator spacer 245. For example, the sacrificial layer 280 may comprise silicon nitride (SiN) and the insulator spacer 245 may comprise silicon oxide ($SiO_2$). In these instances, the sacrificial layer 280 may be removed using wet etching methods to selectively remove the sacrificial layer 280 without removing the insulator spacer 245. For example, hydrogen fluoride or phosphoric acid may be used to selectively wet etch the silicon nitride sacrificial layer 280 without removing the silicon oxide insulator spacer 245. Once the sacrificial layer 280 is removed, there may be an opening 290 extending to the conductive heating layer 230 and a larger opening 292 in the areas that the sacrificial layer 280 previously sat.

Figure 8:
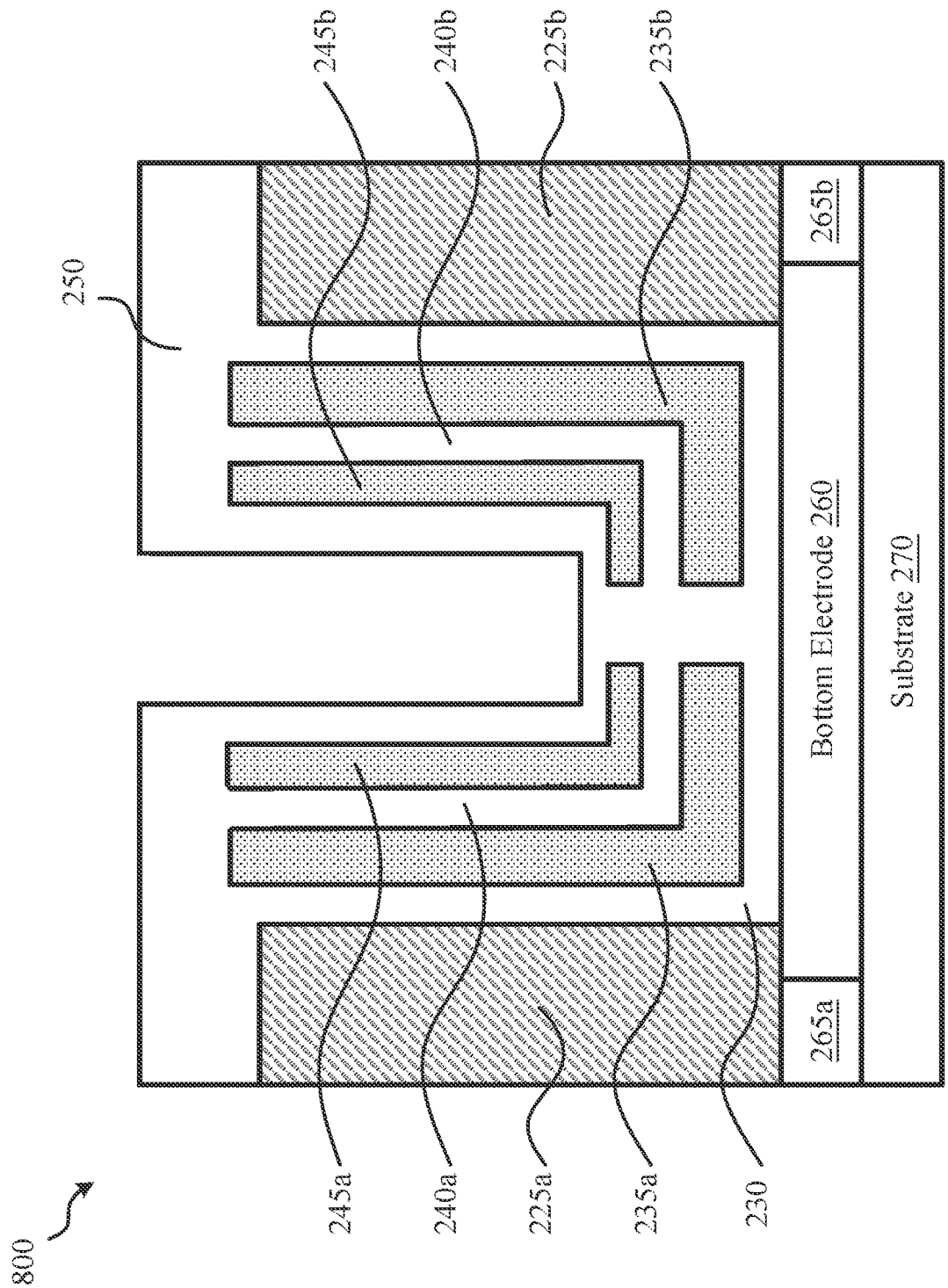
FIG. 8 depicts a schematic diagram of a seventh intermediary step of depositing a conformal coating of a conductor material, according to some embodiments.

Referring to FIG. 8, a seventh intermediary step 800 of depositing a conformal coating 250 of a conductor material is depicted, according to some embodiments. The conformal coating 250 may fill the opening, or via, 290 and may partially fill the larger opening, or via, 292. In some embodiments, the conformal coating 250 is a conductor material (for example, TiN). In some embodiments, the conformal coating 250 is a same conductor material as one or more of the conductive heating layers 230 and 240. By filling the opening 290, the conformal coating 250 may expose each of the conductive heating layers 230 and 240 to the bottom electrode 260. This allows for any currents transmitted from the bottom electrode 260 to transmit through the conductive heating layers 230 and 240 and the conformal coating 250. The conformal coating 250 may conform to the contours and openings of the existing portions of the phase change memory, which may allow the conformal coating 250 to fill the opening 290. The conformal coating 250 may be deposited using similar methods as the previous layer depositions (discussed in FIGS. 4 and 5) such as atomic layer deposition (ALD), chemical vapor deposition (CVD), and/or laser induced chemical vapor disposition (LCVD).

Figure 9:
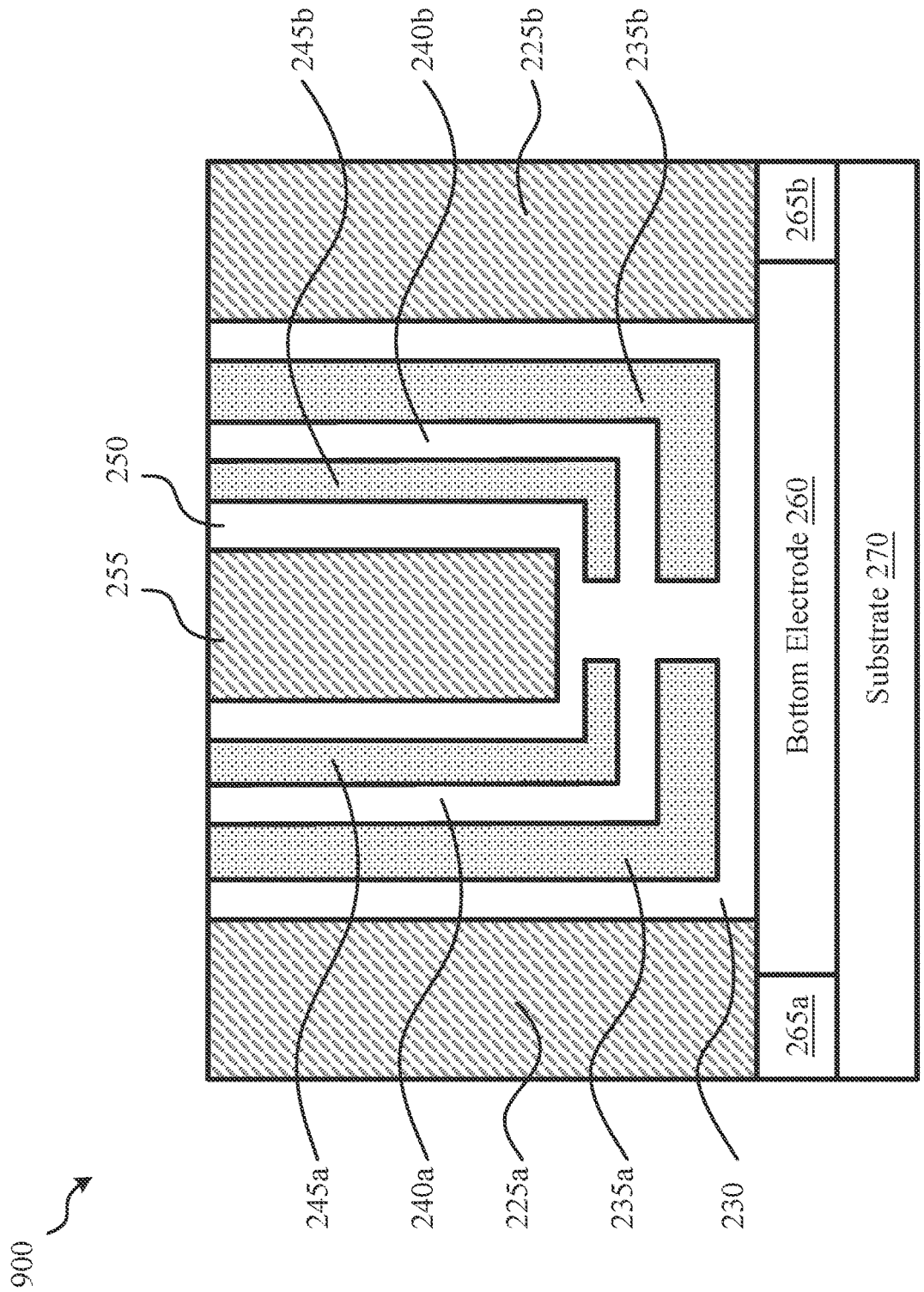
FIG. 9 depicts a schematic diagram of an eighth intermediary step of removing some portions of the layers and depositing an insulator core, according to some embodiments.

Referring to FIG. 9, an eighth intermediary step 900 of removing some portions of the layers and depositing an insulator core is depicted, according to some embodiments. Intermediary step 900 may include etching the top side portions of the conformal coating 250 as well as any remaining portions of the layers 230, 235, 240, and 245 that remain above the dielectric 225. The etching may be executed using the same or similar methods as discussed above in relation to FIG. 6. The etching may result in conformal coating 250 acting as another conductive heating layer, therefore conformal coating 250 may also be referred to as conductive heating layer 250. Further, by etching any excess layers 230, 235, 240, 245, and 250, the heating component (comprising conductive heating layers 230, 240, and 250 as well as insulator spacers 235, and 245) may be in a concentric ring-shape.

In addition to etching any excess layers 230, 235, 240, 245, and 250, the remaining opening, or via, may be filled with an insulator material. This results in an insulator core 255 at a center of the concentric ring-shaped heater (comprising conductive heating layers 230, 240, and 250 as well as insulator spacers 235, and 245 and the insulator core 255). In some embodiments, the insulator core 255 is composed of the same material as the dielectric 225. The insulator core 255 may prevent too much current from being transmitted to the phase change material, which helps make the change between phases more gradual.

In some embodiments, once the opening is filled with the insulator core 255, the surfaces of the phase change memory may be polished (for example, using chemical mechanical polishing (CMP)), this may smooth any exposed surfaces, particularly the top surfaces of the dielectric 225, conductive heating layers 230, 240, and 250, insulator spacers 235 and 245, and insulator core 255, as these surfaces have been etched at different times and sometimes even repeatedly etched. Polishing the surfaces may smooth out any slight imperfections due to the etching.

Figure 10:
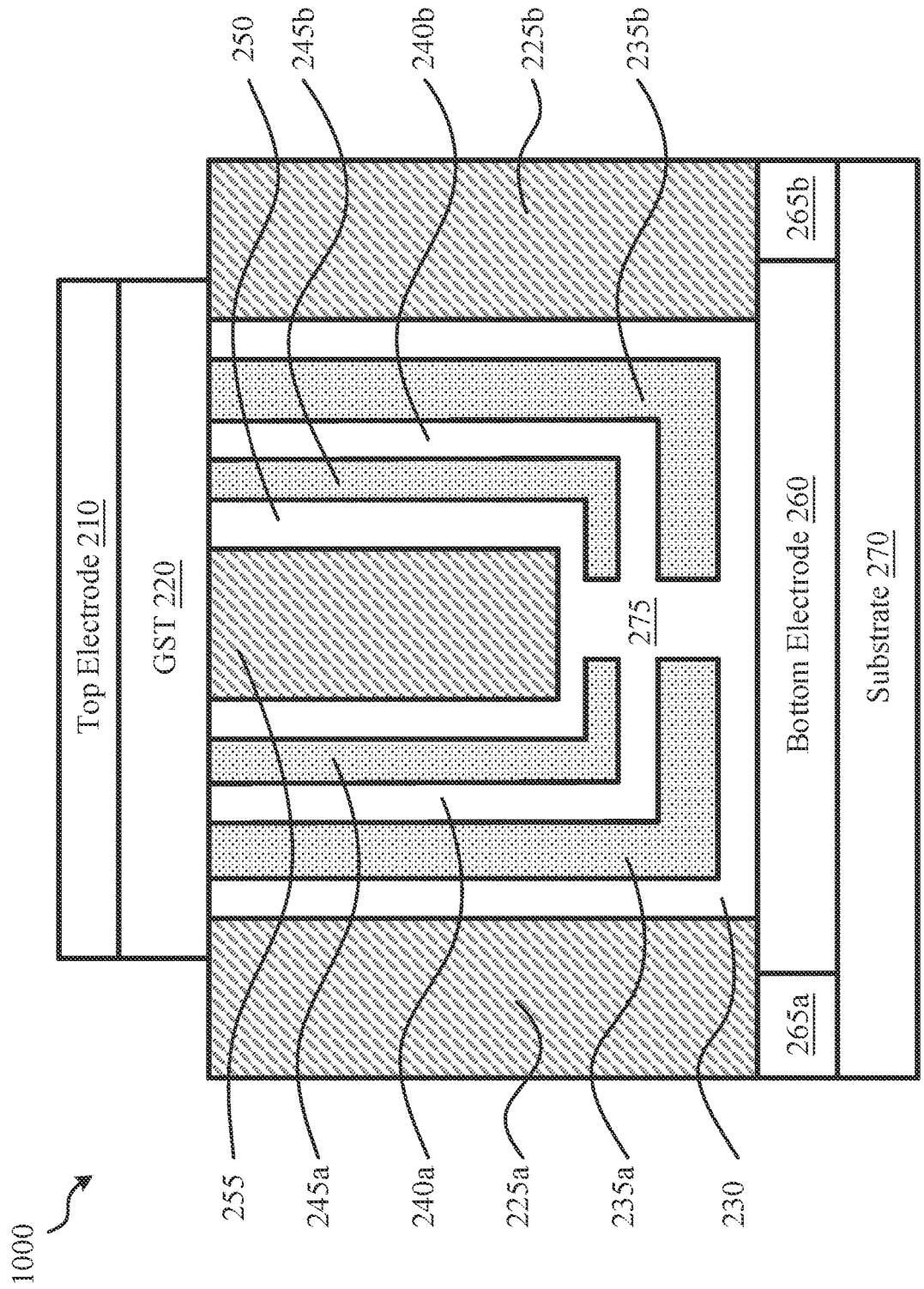
FIG. 10 depicts a schematic diagram of a fully formed phase change memory with a concentric ring-shaped heater, according to some embodiments.

Referring to FIG. 10, a fully formed phase change memory 1000 with a concentric ring-shaped heater is depicted, according to some embodiments. Once the concentric ring-shaped heater (comprising conductive heating layers 230, 240, and 250 as well as insulator spacers 235, and 245 and the insulator core 255) is formed, the heater may be topped with a phase change material (here, GST 220) and a top electrode 210. In this exemplary instance, the phase change material is GST 220, however GST 220 may be replaced with other comparable phase change materials.

In phase change memory 1000, each of the conductive heating layers 230, 240, and 250 are exposed to the bottom electrode 260 through the conductive stud 275 (which is the filled opening that was previously opening 290). Through conductive stud 275, each conductive heating layer 230, 240, and 250 may transmit current into GST 220 (which is the phase change material). The portions of GST 220 that are exposed to the current may change phases, in some instances. This is further discussed in FIG. 11.

Insulator spacers 235 and 245 as well as insulator core 255 may prevent GST 220 from being exposed to too much current, which could result in an abrupt change between phases. For example, if exposed to too much current, GST 220 may abruptly change from a crystalline phase to an amorphous phase, which may not be beneficial for certain phase change memory applications. Phase change memory 1000 may allow for a gradual change of phases for GST 220.

Although phase change memory 1000 depicts only dielectric 265 and dielectric 225, the top electrode 210 and the GST 220 may also be surrounded by dielectric, similar to phase change memory 100 (FIG. 1). Additionally, phase change memory 1000 is a cross-sectional view of the phase change memory. In a top down view of phase change memory 1000, the heater (comprising conductive heating layers 230, 240, and 250 as well as insulator spacers 235, and 245 and the insulator core 255) has a concentric ring-shape similar or the same as heater 130 (FIG. 1).

Figure 11:
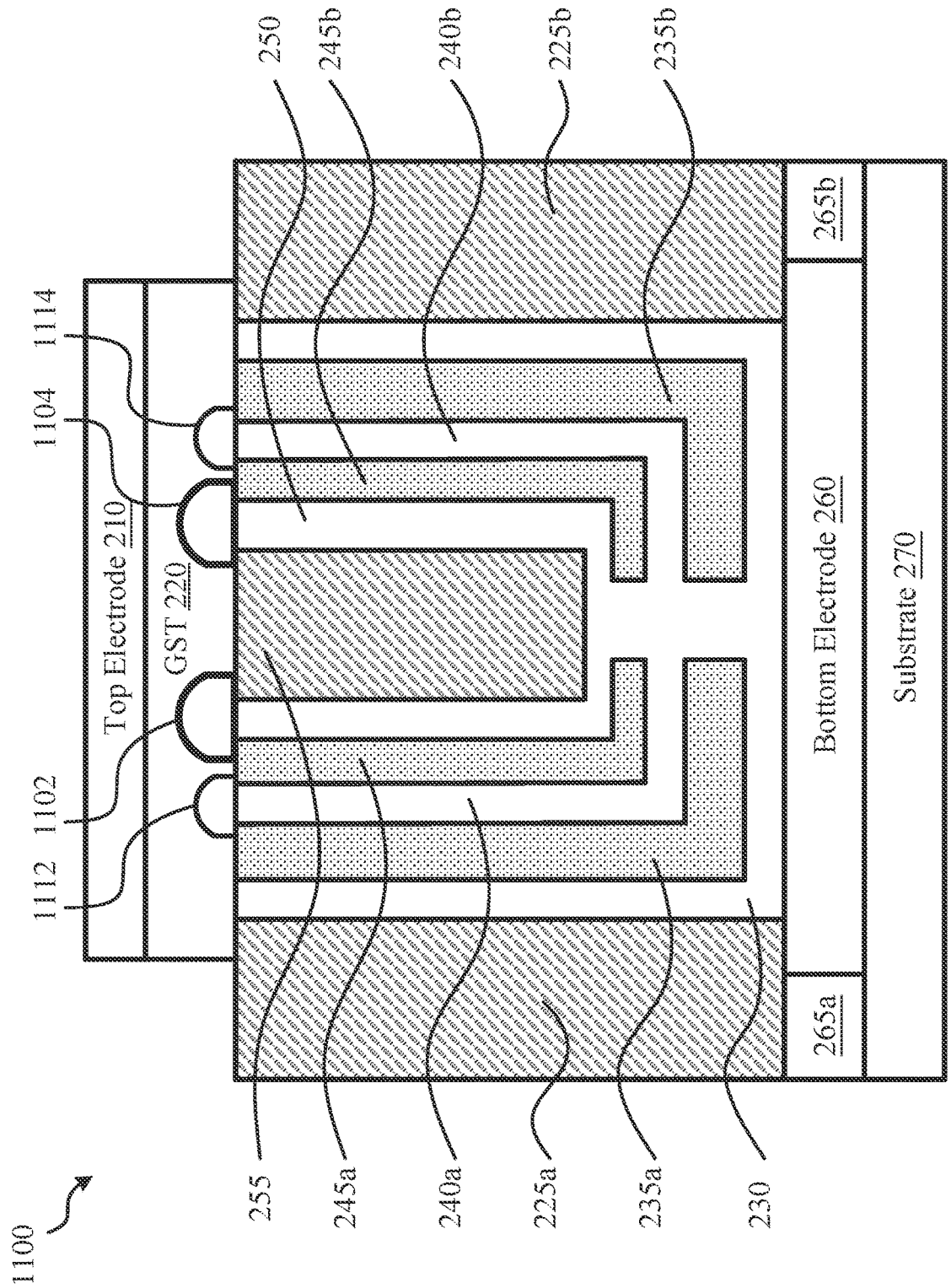
FIG. 11 depicts a schematic diagram of a phase change memory with a phase change material with both crystalline and amorphous phases, according to some embodiments.

Referring to FIG. 11, a phase change memory 1100 with a phase change material with both crystalline and amorphous phases is depicted, according to some embodiments. As discussed herein, a concentric ring-shaped heater (for instance, comprising conductive heating layers 230, 240, and 250 as well as insulator spacers 235, and 245 and the insulator core 255) enables a more gradual transition of phases for GST 220. In addition, the concentric ring-shaped heater may enable more phases of GST 220, such as intermediate phases with both crystalline phases and amorphous phases. Phase change memory 1100 and GST 220 depicts an exemplary intermediate phase.

As discussed herein, the conductive heating layers 230, 240, and 250 may be different materials, thicknesses, etc., which may affect the conductance and resistance of each conductive heating layer 230, 240, and 250. This means that the current from the bottom electrode 260 may not be exposed to the GST 220 at the same amounts and/or the same speeds based on how the current is transmitted through each conductive heating layer. For example, conductive heating layer 230 may be made up of a material that has more resistivity than conductive heating layers 240 and 250. Therefore, in this example, conductive heating layer 230 may resist some of the current from bottom electrode 260 and may not transmit as much current to GST 220 as conductive heating layers 240 and 250. Therefore, as depicted in FIG. 11, the GST 220 may be crystalline and not amorphous in the areas near conductive heating layer 230 because heating layer 230 may not transmit enough current to change the phase of GST 220 to amorphous.

However, in this example, the materials of conductive heating layers 240 and 250 may be more conductive and less resistive than conductive heating layer 230, and more current may have been transmitted from the bottom electrode 260 to the GST 220 through these layers, resulting in amorphous areas 1112, 1102, 1104, and 1114 in the areas of the GST 220 near conductive heating layers 240 and 250. Further, amorphous areas 1102 and 1104 are larger than amorphous areas 1112 and 1114. In this example, this may be because conductive heating layer 250 is made of a material even more conductive than conductive heating layer 240. Therefore, although the same amount of current may have been transmitted from bottom electrode 260, conductive heating layer 230 may have blocked the most amount of current from reaching GST 220 (due to the resistivity of the material of layer 230), conductive heating layer 240 may have blocked some of the current from reaching GST 220 (due to the greater conductivity than layer 230 but lesser conductivity than layer 250), and conductive heating layer 250 may have transmitted the most current through to GST 220 (due to the greater conductivity than the other layers). Amorphous areas 1102 and 1104 may have been exposed to the most current/heat from layer 250, therefore they may be larger than amorphous areas 1112 and 1114.

In another example, conductive heating layers 240 and 250 may comprise the same materials, however conductive heating layer 250 may have a greater width (i.e., may be more thick) than conductive heating layer 240. In this example, amorphous areas 1102 and 1104 may have formed more quickly than amorphous layers 1112 and 1114, because areas 1102 and 1104 of GST 220 may have been exposed to a larger area of current through conductive heating layer 250 (so areas 1102 and 1104 may have been more rapidly heated and then quenched through conductive heating layer 250)

compared to conductive heating layer 240. As conductive heating layer 240 is made of the same material (and has the same conductance and resistance) as conductive heating layer 250, areas 1112 and 1114 of GST 220 do become amorphous, however it make take a longer period of time than the time to form amorphous areas 1102 and 1104, due to the lower area of contact between conductive heating layer 240 and GST 220. Therefore, amorphous areas 1102 and 1104 are larger than amorphous areas 1112 and 1114.

Figure 12:
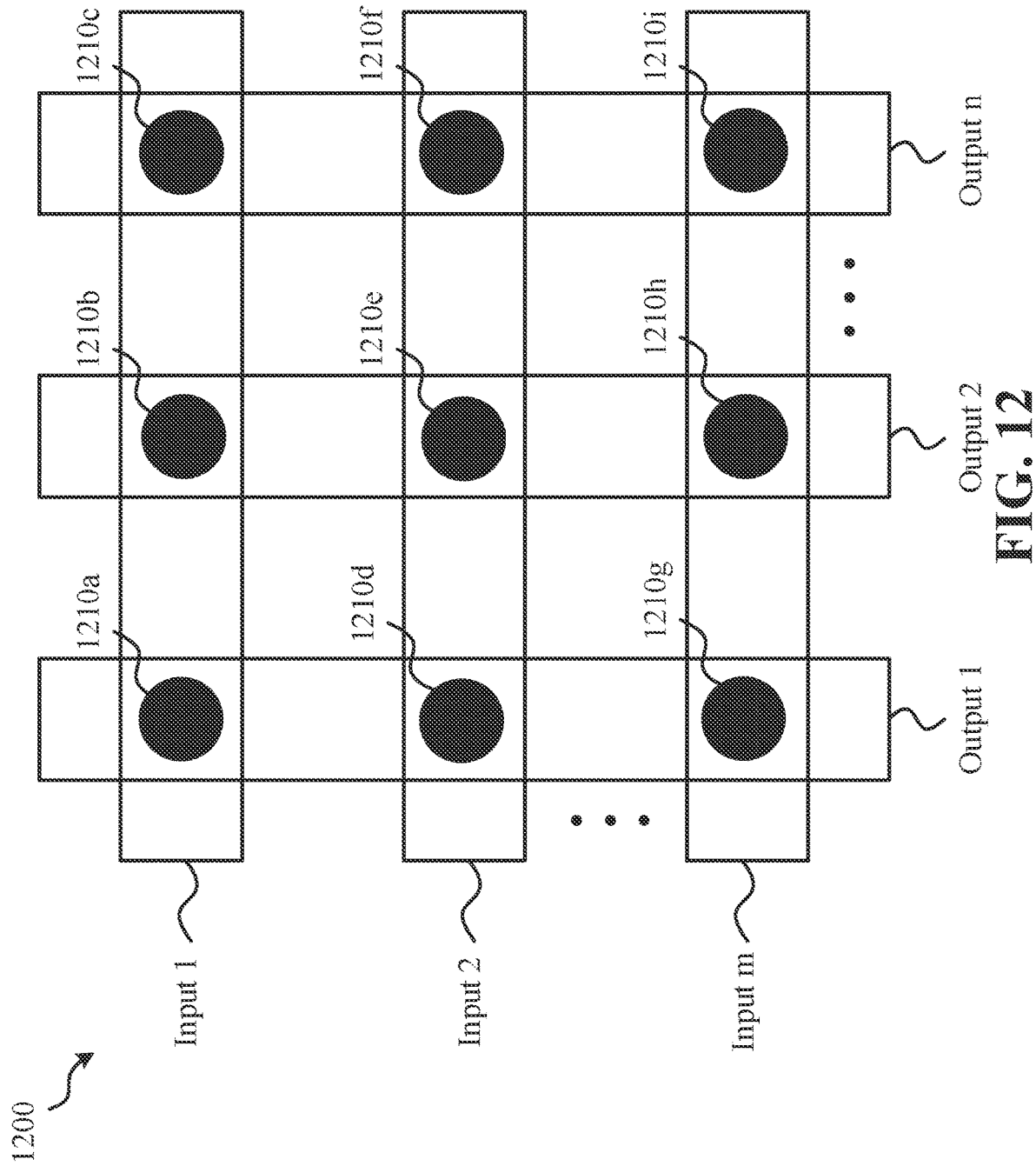
FIG. 12 depicts a schematic diagram with an array of phase change memory cells, according to some embodiments.

Referring to FIG. 12, an array 1200 of phase change memory cells is depicted, according to some embodiments. In some instances (for example, in neuromorphic computing), a system may include multiple phase change memory cells 1210a-i (referred to collectively as phase change memory cells 1210). Each phase change memory cell 1210 may correspond to phase change memory 100 (FIG. 1), phase change memory 1000 (FIG. 10), and/or phase change memory 1100 (FIG. 11). Phase change memory cells 1210 could also correspond to phase change memory 1400 (FIG. 14) and/or phase change memory 1500 (FIG. 15), in some instances). Phase change memory array 1200 may have inputs 1-$m$ and outputs 1-$n$ with an array of phase change memory cells 1210 in between.

Figure 13:
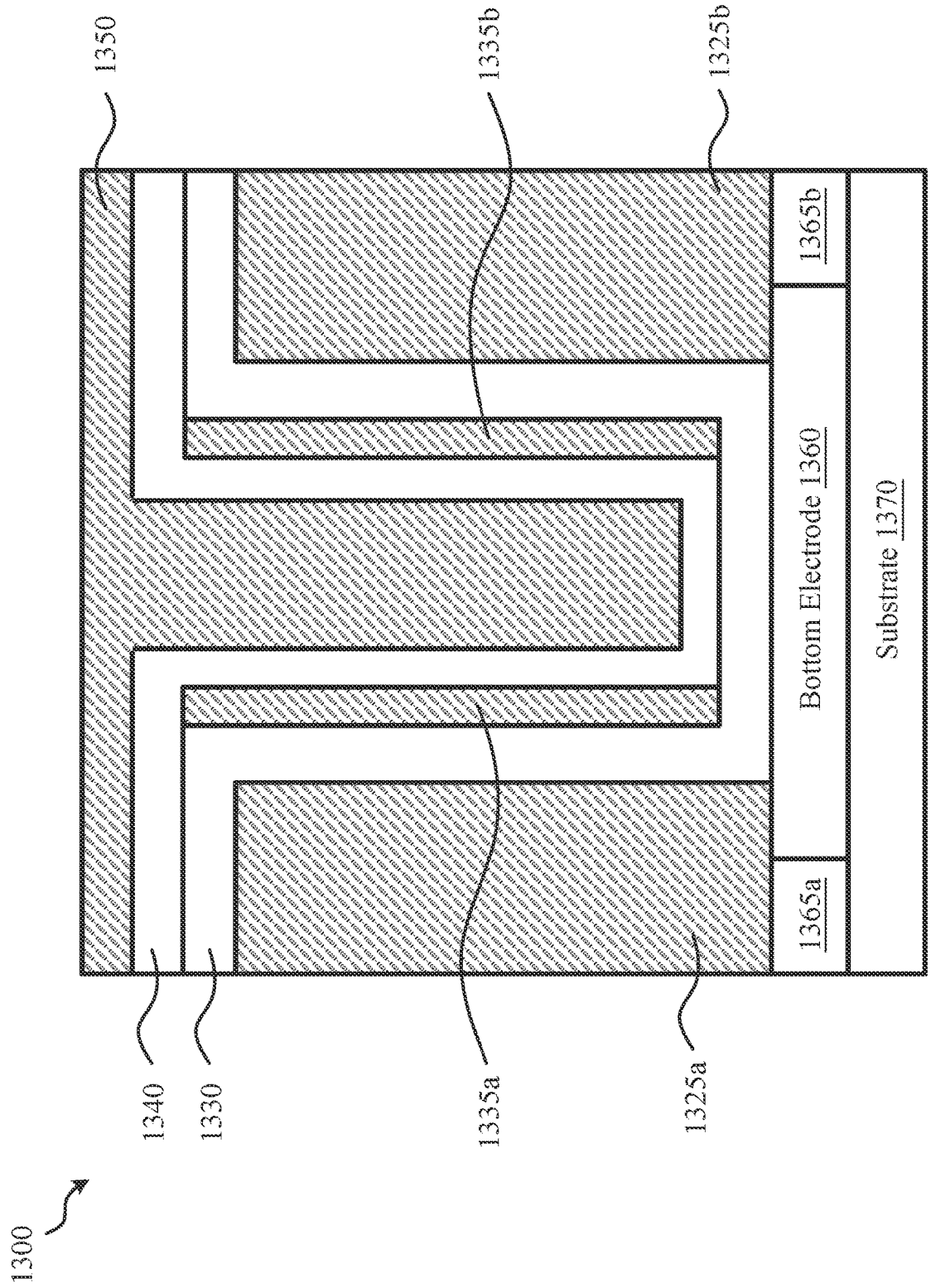
FIG. 13 depicts a schematic diagram of an intermediate phase of a second exemplary phase change memory with a concentric ring-shaped heater, according to some embodiments.

Referring to FIG. 13, an intermediate step 1300 of a second exemplary phase change memory 1400 (FIG. 4) with a concentric ring-shaped heater is depicted, according to some embodiments. Phase change memory 1000 (FIG. 10) and 1100 (FIG. 11) may be an exemplary phase change memory with a concentric ring-shaped heater, however there may be alternative structures of a phase change memory with a concentric ring-shaped heater. Phase change memory 1400 (FIG. 4) is one alternative structure to a phase change memory with a concentric ring-shaped heater. Intermediate step 1300 is an intermediate phase of forming phase change memory 1400. In intermediate step 1300, there is a substrate 1370, bottom electrode 1360, dielectric 1365a and 1365b (referred to collectively as dielectric 1365, as well as dielectric 1325a and 1325b (referred to collectively as dielectric 1325. These may correspond to substrate 270, bottom electrode 260, dielectric 265, and dielectric 225, respectively (from FIGS. 2-11).

However, unlike intermediate step 400 (FIG. 4) where each layer is distributed on top of each other without adjusting the previous layer, intermediate step 1300 may deposit conductive heating layer 1330 and then insulator spacer 1335 similar (or the same as) intermediate step 400, but then may selectively remove portions of the insulator spacer 1335 before distributing any additional layers. For instance, as depicted, the bottom and top side portions of insulator spacer 1335 have been selectively removed so that only the side portions 1335a and 1335b remain. Without any selective removal, insulator spacer 1335 may have looked the same or similar to insulator spacer 235 (FIGS. 2-11). In some instances, the portions of insulator spacer 1335 are selectively removed through a RIE. In some instances, the portions of insulator spacer 1335 may be selectively removed using etching techniques such as buffered oxide etching, hydrogen fluoride etching, phosphoric acid etching, or any other method of etching.

Once only portions 1335a and 1335b remain on insulator spacer 1335, conductive heating layer 1340 may be distributed (for example, the same way conductive heating layer 1330 was distributed). By selectively removing insulator spacer 1335, conductive heating layer 1340 is in direct contact with conductive heating layer 1330, and is therefore able to receive current from bottom electrode 1360 through conductive heating layer 1330. This may eliminate the need for a sacrificial layer 280 (as depicted in FIG. 5), patterning an opening through the layers (as depicted in FIG. 6), and depositing a conformal coating to form stud 250 (as depicted in FIG. 8 and FIG. 10) to connect the conductive heating layers to the bottom electrode.

Once each conductive heating layer 1330 and 1340 are deposited, an insulator layer 1350 is deposited on top of the heating layer 1340 and fills the opening in the center. Insulator layer 1350 acts as the insulator core (and may be referred to as insulator core 1350).

Although only two conductive heating layers 1330 and 1340 and only one insulator spacer 1335 are depicted, there may be any number of conductive heating layers. Each conductive heating layer may be separated by an insulator spacer, and each insulator spacer may be selectively removed (similar/the same as insulator spacer 1335) so that each conductive heating layer has direct contact to the conductive heating layer below it.

Figure 14:
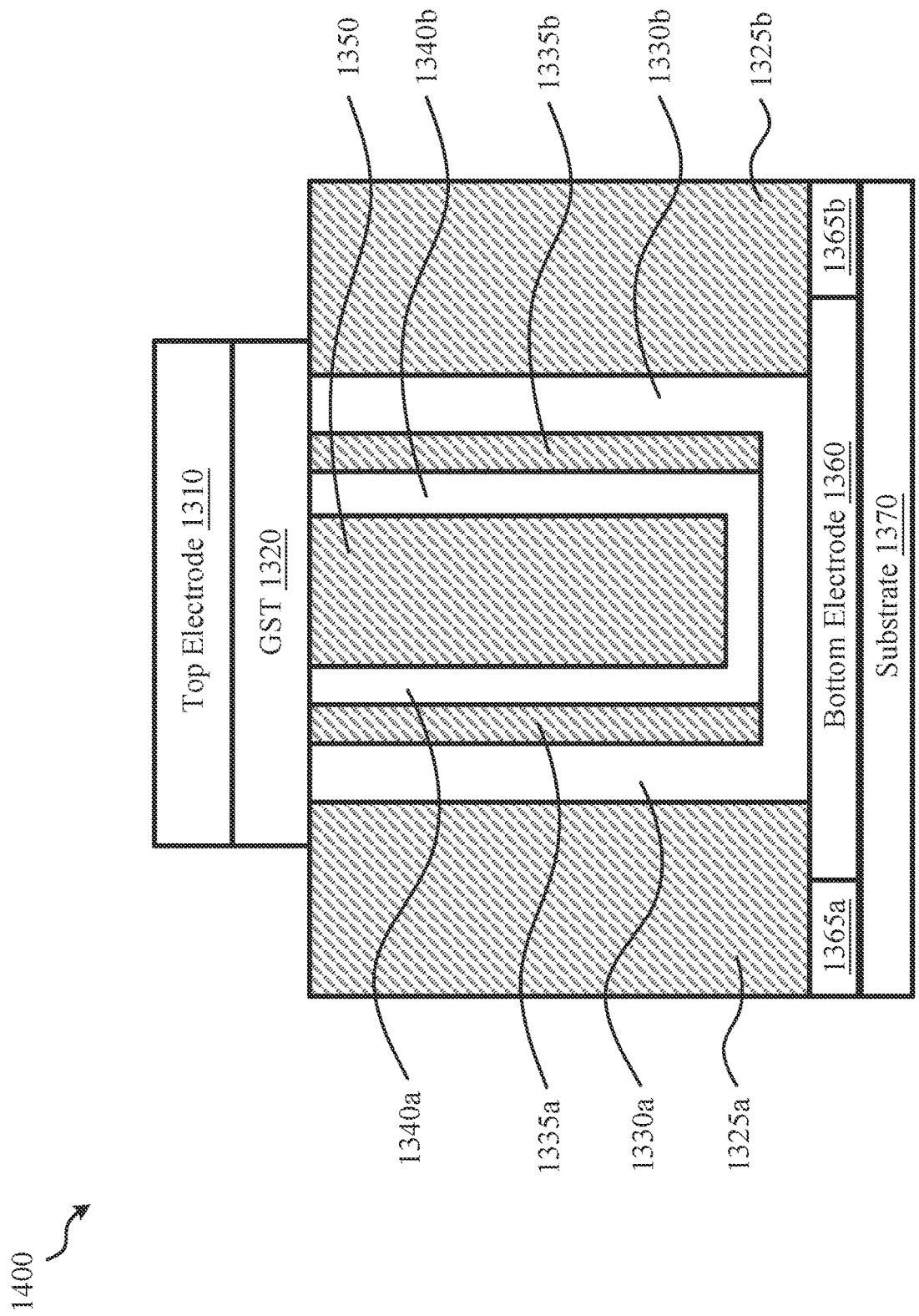
FIG. 14 depicts a schematic diagram of the second exemplary phase change memory with a concentric ring-shaped heater, according to some embodiments.

Referring to FIG. 14, the second exemplary phase change memory 1400 with a concentric ring-shaped heater is depicted, according to some embodiments. In some embodiments, phase change memory 1400 is the fully formed phase change memory that was in the process of being formed at intermediate phase 1300 (depicted in FIG. 13). Before phase change memory is fully formed (as depicted in phase change memory 1400), the portions of conductive heating layers 1330 and 1340 as well as insulator core 1350 that sit on top of dielectric 1325 may be removed (similar to intermediary step 900 (FIG. 9) and/or intermediary step 600 (FIG. 6)). Further, in some instances, the materials may be polished (for example, using CMP) prior to depositing GST 1320 and the top electrode 1310. In phase change memory 1400, the heater is still a concentric ring-shaped heater, however, unlike phase change memory 1000 (FIG. 10) and/or 1100 (FIG. 11), each conductive heating layer 1330 and 1340 has direct contact with each other on the bottom portion of the heater, therefore the current from the bottom electrode 1360 is able to reach each conductive heating layer (e.g., 1340) through the first conductive heating layer 1330.

Figure 15:
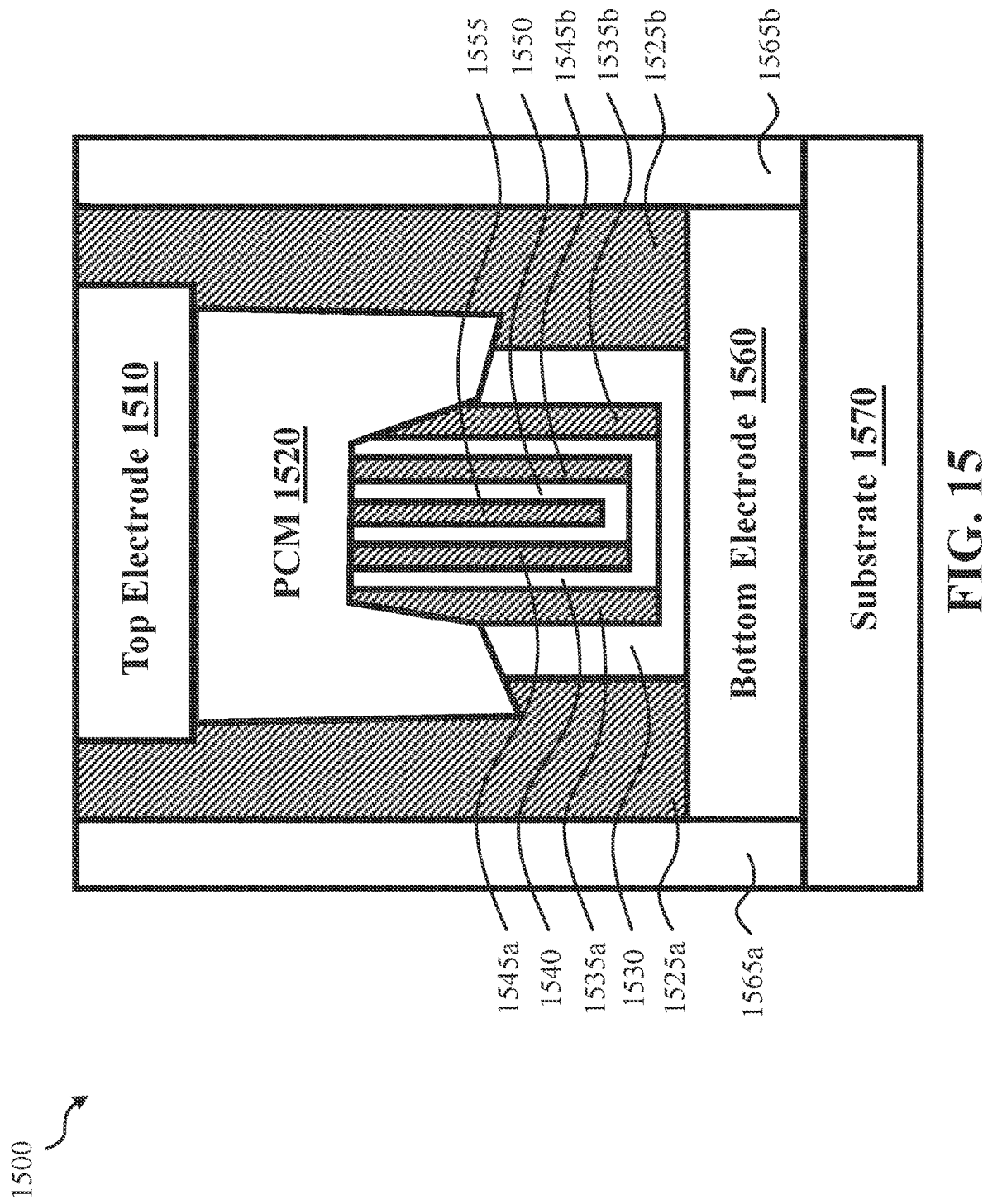
FIG. 15 depicts a schematic diagram of a third exemplary phase change memory with a concentric ring-shaped heater, according to some embodiments.

Referring to FIG. 15, a third exemplary phase change memory 1500 with a concentric ring-shaped heater is depicted, according to some embodiments. Phase change memory 1500 may be similar to phase change memory 1400 and may be formed in a similar manner. For example, substrate 1570, bottom electrode 1560, dielectric 1565, dielectric 1525, conductive heating layer 1530, insulator spacer 1535, and conductive heating layer 1540 may correspond to substrate 1370, bottom electrode 1360, dielectric 1365, dielectric 1325, conductive heating layer 1330, insulator spacer 1335, and conductive heating layer 1340 (FIG. 13 and FIG. 14) respectively. Further, insulator core 1555 may correspond to insulator core 1350 (FIGS. 13 and 14). Phase change memory 1500 includes an additional conductive heating layer 1550 and an additional insulator spacer 1545, however these layers may be deposited and selectively removed in the same, or similar, methods as conductive heating layers 1330 and 1340 and insulator spacer 1335 (FIG. 13).

However, unlike in phase change memory 1400 (FIG. 14), in phase change memory 1500 conductive heating layer 1530 may be patterned and/or etched to shorten its length. In some embodiments, conductive heating layer 1530 may be etched before depositing insulator spacer 1535. In some embodiments, conductive heating layer 1530 may be etched after all the other layers have been deposited and etched or patterned, but before polishing. Although only conductive heating layer 1530 has been shortened, any of the conductive heating layers may be shortened. When a conductive heating layer has been shortened, the length of the insulator spacers (such as insulator spacer 1535) may also be adjusted in order to maintain a cohesive shape of the concentric ring-shaped heater.

Additionally, as discussed herein, the conductive heating layers may be different widths. In phase change memory 1500, conductive heating layer 1530 has a larger width and conductive heating layers 1540 and 1550 have a smaller (i.e., thinner) width. Because conductive heating layer 1530 has a greater width, more of PCM 1520 may be exposed to current in those areas, so PCM 1520 may change phases more quickly in the areas near conductive heating layer 1530. Further, conductive heating layer 1530 is shorter in length than the other conductive heating layers, therefore the PCM 1520 may be exposed to current even more quickly (and may change phases even more quickly) because conductive heating layer 1530 has a higher conductance than conductive heating layers 1540 and 1550.

Figure 16:
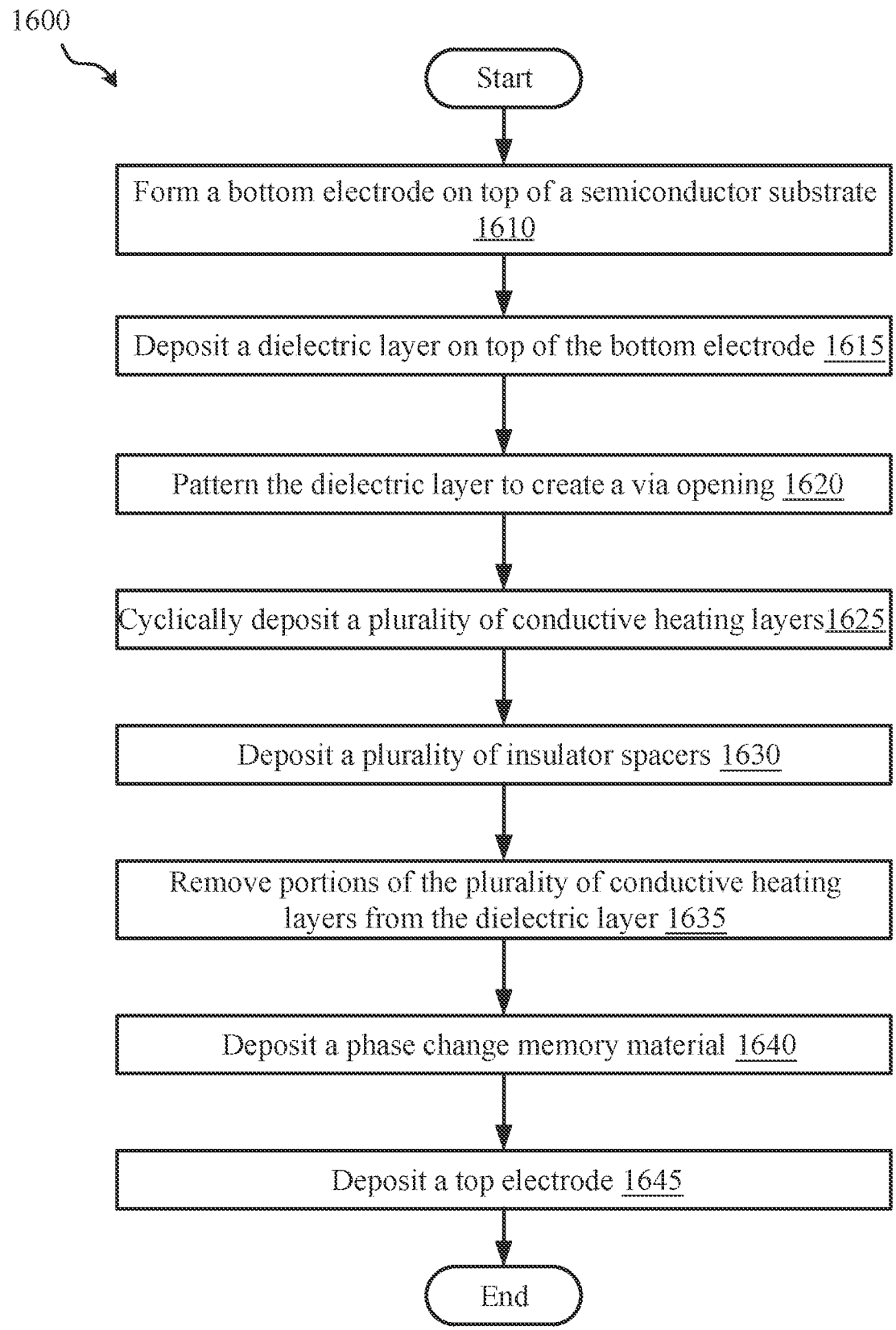
FIG. 16 depicts a flowchart of an exemplary method for forming a phase change memory with a concentric ring-shaped heater, according to some embodiments.

Referring to FIG. 16, a flowchart of an exemplary method 1600 for forming a phase change memory with a concentric ring-shaped heater is depicted, according to some embodiments. In some embodiments, method 1600 may be an overall method for forming a phase change memory (such as phase change memory 100 (FIG. 1), phase change memory 1000 (FIG. 10), phase change memory 1100 (FIG. 11), phase change memory 1400 (FIG. 14), and/or phase change memory 1500 (FIG. 15).

Method 1600 includes operation 1610 to form a bottom electrode on top of a semiconductor substrate. In some instances, the bottom electrode is formed on top of the semiconductor substrate using a CMOS BEOL damascene process. In some embodiments, this operation may correspond to intermediate step 200 (FIG. 2).

Method 1600 includes operation 1615 to deposit a dielectric layer on top of the bottom electrode. This may correspond to intermediate step 300 (FIG. 3). In some embodiments, as depicted in FIG. 2 and FIG. 3, a preexisting dielectric may surround either side of the bottom electrode, and the dielectric layer may be deposited on top of the preexisting dielectric and the bottom electrode. In some embodiments, depositing the dielectric layer may include depositing the dielectric surrounding the bottom electrode (e.g., dielectric 265 (FIG. 2)).

Method 1600 includes operation 1620 to pattern the dielectric layer to create a via opening. The dielectric may initially be deposited in a large layer (for example, as depicted in FIG. 2) and the dielectric may need to be patterned to create an opening for the concentric layers to be deposited within. In some embodiments, operation 1620 corresponds to intermediate step 300 (FIG. 3).

Method 1600 includes operation 1625 to cyclically deposit a plurality of conductive heating layers and operation 1630 to deposit a plurality of insulator spacers. In some embodiments, (for example, when operation 1625 corresponds to intermediate step 400 (FIG. 4)) operations 1625 and 1630 may be executed concurrently with alternating layers of conductive heating layers and insulator spacers being deposited. In some embodiments (for example, when forming phase change memory 1400 (FIG. 14) and/or phase change memory 1500 (FIG. 15)), a first conductive heating layer may be cyclically deposited and then a first insulator spacer may be cyclically deposited, and then the first insulator spacer may be selectively removed so that that the second conductive heating layer, when it is deposited, has direct contact with the first conductive heating layer. These steps may be repeated for each conductive heating layer and each insulator spacers so that each conductive heating layer has contact with the previous heating layer and is able to receive current transmitted from the bottom electrode. In some embodiments, after a conductive heating layer is deposited, it may be patterned and/or etched to shorten the length.

In some embodiments, when a phase change memory such as phase change memory 1000 (FIG. 10) and/or phase change memory 1100 (FIG. 11) is formed, method 1600 may further include depositing a sacrificial layer of insulator material leaving a small opening in the center, extending the opening by patterning through the conductive heating layers and the insulator spacers (resulting in an opening that extends to the first conductive heating layer), etching the side portions of the layers so that the first conductive heating layer is the only layer with a portion extending over the dielectric, removing the remainder of the sacrificial layer, and/or depositing a conformal coating to fill the patterned opening (creating a stud) and partially coat the exposed layers. This may correspond to intermediate steps 300-800 (FIGS. 3-8) discussed herein. These steps may be skipped when each insulator layer is selectively removed (discussed above).

In some embodiments, method 1600 may include depositing an insulator core (not depicted in FIG. 16). When the phase change memory is formed as depicted in FIGS. 2-10, depositing an insulator core may correspond to intermediate step 900 (FIG. 9). In these instances, operation 1635 may occur prior to depositing the insulator core so that any portions of the layers (i.e., conductive heating layers and insulator spacers) that extend above the dielectric layer may be removed and then the insulator core may be deposited at the center of the concentric rings/layers.

In some embodiments, when a phase change memory is formed as depicted in FIGS. 13 and 14, and/or 15, an insulator layer may be deposited (as discussed herein) on top of a top concentric heating layer, and this insulator layer may act as the insulator core and the final insulator spacer. In these instances, operation 1635 may occur after the insulator layer/core is deposited (as depicted in FIGS. 13 and 14) so that the top side portions of the insulator layer are removed with the other layers.

Method 1600 includes operation 1635 to remove portions of the plurality of conductive heating layers from the dielectric layer. To form the final concentric ring-shape of the heater, excess portions of the layers may be removed. In some instances, such as when the insulator layers have previously been selectively removed, only portions of the conductive heating layers may be removed. In some instances, both excess portions of conductive heating layers and excess portions of insulator spacers may be removed in this operation. In some embodiments, removing portions of the conductive heating layers and/or the insulator spacers may include etching any portions of the layers that are above the dielectric. In some instances, operation 1635 corresponds to intermediary step 900 (FIG. 9).

Method 1600 includes operation 1640 to deposit a phase change memory material and operation 1645 to deposit a top electrode. The phase change material (or phase change memory material) may be deposited or formed using similar, or the same, methods as forming the bottom electrode and the semiconductor substrate. In some instances, the phase change memory material and/or the top electrode may be patterned to remove any excess portions.

Method 1600 is only one possible method of forming a phase change memory with a concentric ring-shaped heater.

The present invention may be a system, a method, etc. at any possible technical detail level of integration. The flowchart and block diagrams in the Figures illustrate the architecture, functionality, and operation of possible implementations of systems, methods, and computer program products according to some embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device comprising:
    a ring-shaped heater comprising:
        a plurality of concentric conductive heating layers; and
        a plurality of insulator spacers, wherein each insulator spacer separates each of the plurality of concentric conductive heating layers, and one insulator spacer of the plurality of insulator spacers is an insulator core that is concentrically surrounded by alternating layers of the plurality of concentric conductive heating layers and a remainder of the plurality of insulator spacers;
    a phase change material proximately connected to the ring-shaped heater;
    a top electrode proximately connected to the phase change material;
    a bottom electrode; and
    a conductive stud located at a bottom of the ring-shaped heater and in contact with the bottom electrode,
    wherein the plurality of concentric conductive heating layers branch from the conductive stud and connect to the bottom electrode through the conductive stud.

2. The device of claim 1, wherein one or more of the concentric conductive heating layers, from the plurality of concentric conductive heating layers, have differing thicknesses.

3. The device of claim 1, wherein one or more of the concentric conductive heating layers, from the plurality of concentric conductive heating layers, have a different composition.

4. The device of claim 1, wherein one or more of the concentric conductive heating layers, from the plurality of concentric conductive heating layers, comprise titanium nitride.

5. The device of claim 1, wherein one or more of the insulator spacers, from the plurality of insulator spacers, comprise at least one of silicon nitride and silicon oxide.

6. The device of claim 1, wherein lengths of the plurality of concentric conductive heating layers are tuned to achieve different resistances.

7. A system comprising:
    a phase change memory, the phase change memory comprising:
        a bottom electrode;
        a ring-shaped heater patterned on the bottom electrode, the ring-shaped heater comprising:
            a plurality of concentric conductive heating layers; and
            a plurality of insulator spacers, wherein each insulator spacer separates each of the plurality of concentric conductive heating layers, and one insulator spacer of the plurality of insulator spacers is an insulator core that is concentrically surrounded by alternating layers of the plurality of concentric conductive heating layers and a remainder of the plurality of insulator spacers,
        a phase change material proximately connected to the ring-shaped heater; and
        a top electrode proximately connected to the phase change material; and
        a conductive stud located at a bottom of the ring-shaped heater and in contact with the bottom electrode,
    wherein the plurality of concentric conductive heating layers branch from the conductive stud and connect to the bottom electrode through the conductive stud.

8. The system of claim 7, wherein one or more of the concentric conductive heating layers, from the plurality of concentric conductive heating layers, have a different thickness.

9. The system of claim 7, wherein one or more of the concentric conductive heating layers, from the plurality of concentric conductive heating layers, have a different composition.

10. The system of claim 7, wherein the plurality of insulator spacers separate side portions of each of the plurality of concentric conductive heating layers, and wherein each of the plurality of concentric conductive heating layers has contact with one or more of the plurality of concentric conductive heating layers on the bottom of the ring-shaped heater.

11. The system of claim 7, wherein:
    one or more of the concentric conductive heating layers, from the plurality of concentric conductive heating layers, have different levels of conductance; and
    the phase change material comprises amorphous phases and crystalline phases based on the different levels of conductance of the one or more of the concentric conductive heating layers.

12. The system of claim 7, further comprising an array of ring-shaped heaters.

13. The system of claim 7, wherein current passes through each of the plurality of concentric conductive heating layers, resulting in the plurality of concentric conductive heating layers executed in parallel.

* * * * *